(12) United States Patent
Akimoto et al.

(10) Patent No.: US 9,881,745 B2
(45) Date of Patent: Jan. 30, 2018

(54) DYE SENSITIZED SOLAR CELL

(71) Applicant: ADEKA CORPORATION, Tokyo (JP)

(72) Inventors: Kensaku Akimoto, Tokyo (JP); Yohei Aoyama, Tokyo (JP); Kenji Kakiage, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 0 days.

(21) Appl. No.: 14/899,129

(22) PCT Filed: Aug. 12, 2014

(86) PCT No.: PCT/JP2014/071285
§ 371 (c)(1),
(2) Date: Dec. 17, 2015

(87) PCT Pub. No.: WO2015/029771
PCT Pub. Date: Mar. 5, 2015

(65) Prior Publication Data
US 2016/0148758 A1 May 26, 2016

(30) Foreign Application Priority Data

Aug. 29, 2013 (JP) .................... 2013-177768

(51) Int. Cl.
*H01G 9/20* (2006.01)
*C09B 23/08* (2006.01)
(Continued)

(52) U.S. Cl.
CPC ....... *H01G 9/2059* (2013.01); *C09B 23/0033* (2013.01); *C09B 23/0058* (2013.01);
(Continued)

(58) Field of Classification Search
None
See application file for complete search history.

(56) References Cited

U.S. PATENT DOCUMENTS

2008/0236663 A1 10/2008 Tanabe
2014/0060641 A1 3/2014 Nazeeruddin et al.

FOREIGN PATENT DOCUMENTS

JP 2005353289 A 12/2005
JP 2008-274230 11/2008
(Continued)

OTHER PUBLICATIONS

Pseudohalogens for Dye-Sensitized TiO2 Photoelectrochemical Cells; Gerko Oskam, et al.; J. Phys. Chem. B: Appl. vol. 105, 2001, pp. 6867-6873.
(Continued)

*Primary Examiner* — Catherine S Branch
(74) *Attorney, Agent, or Firm* — Young & Thompson

(57) ABSTRACT

Disclosed is a dye-sensitized solar cell which includes a working electrode and a counter electrode facing each other with an electrolyte layer therebetween, the working electrode having a dye-supporting metal oxide electrode composed of a metal oxide layer having a dye supported thereon. The dye contains a cyanine dye, and the electrolyte of the electrolyte layer contains a cobalt-based electrolyte. It is preferred to use at least one cyanine dye represented by general formula (1) as the cyanine dye. An$^{q-}$ represents a q-valent anion, wherein q represents 1 or 2, and p represents a coefficient for maintaining overall charge neutrality.

16 Claims, 1 Drawing Sheet

(51) Int. Cl.
*C09B 23/06* (2006.01)
*H01L 51/00* (2006.01)
*C09B 23/01* (2006.01)
*C09B 23/10* (2006.01)
*C09B 57/00* (2006.01)
*C09B 57/10* (2006.01)

(52) U.S. Cl.
CPC .......... *C09B 23/0066* (2013.01); *C09B 23/06* (2013.01); *C09B 23/083* (2013.01); *C09B 23/105* (2013.01); *C09B 57/00* (2013.01); *C09B 57/10* (2013.01); *H01G 9/2013* (2013.01); *H01G 9/2018* (2013.01); *H01L 51/0072* (2013.01); *H01G 9/2031* (2013.01); *H01L 51/0064* (2013.01); *H01L 51/0083* (2013.01); *Y02E 10/542* (2013.01)

(56) References Cited

FOREIGN PATENT DOCUMENTS

| JP | 2010-157373 | 7/2010 |
|---|---|---|
| JP | 2013-025949 | 2/2013 |
| JP | 2013077449 A | 4/2013 |
| JP | 2014-078472 | 5/2014 |
| JP | 2014-127252 | 7/2014 |
| WO | 2010/038589 | 4/2010 |
| WO | WO 2012/114315 | 8/2012 |
| WO | 2012-133488 | 10/2012 |

OTHER PUBLICATIONS

Substituted Polypridine Complexes of Cobalt (II/III) as Efficient Electron-Transfer Mediators in Dye-Sensitized Solar Cells; Shawn A. Sapp, et al.; J. Phys. Chem Soc., vol. 124, 2001, pp. 11215-11222.

Supplementary European Search Report dated Mar. 22, 2017 in corresponding European Patent Application No. 14839829.0.

Min Guo et al., "Photoelectrochemical studies of nanocrystalline TiO2 co-sensitized by novel cyanine dyes", Solar Energy Materials & Solar Cells, Elsevier Science Publishers, Amsterdam, NL, vol. 88, No. 1, Jun. 15, 2005, pp. 23-35, XP027815110, ISSN: 0927-0248.

Thomas W. Hamann et al., "The end of iodide? Cobalt complex redox shuttles in DSSCs", Dalton Transactions, vol. 41, No. 11, Jan. 1, 2012, pp. 3111-3115, XP55056149, ISSN: 1477-9226, DOI: 10.1039/c2dt12362b.

Intenational Search Report, PCT/JP2014/071285, dated Oct. 28, 2014.

DYE SENSITIZED SOLAR CELL

TECHNICAL FIELD

This invention relates to a dye-sensitized solar cell.

BACKGROUND ART

A dye-sensitized solar cell generally has an electrode having an oxide semiconductor as a carrier for a dye. The dye supported on the carrier is to be excited on absorbing incident light and inject electrons into the carrier to perform photoelectric conversion. Dye-sensitized photoelectric solar cells of this type are expected to theoretically achieve high energy conversion efficiency and be produced at lower cost than those having a conventional silicone semiconductor, which will provide a great economical advantage.

The photoelectric efficiency of a solar cell is represented by the product of the generated current and the generated voltage. Approaches to the improvement of generated current under study include development of a dye having a broadened absorption wavelength range and a combined use of dyes having different absorption wavelength ranges. Organic dyes such as ruthenium complex dyes and cyanine dyes are widely known for use in dye-sensitized solar cells. Inter alia, various studies have been directed to cyanine dyes for their relatively high stability and ease of synthesis. For example, Patent Document 1 below discloses a cyanine dye having a carboxyl group as an anchor group to be adsorbed onto an oxide semiconductor electrode.

On the other hand, studies on changing an electrolyte have been reported as an approach to the improvement on generated voltage. Specifically, it has been proposed to replace an iodine-based electrolyte, which has been commonly used mainly for its low cost, with $(SCN)_2/SCN^-$, $(SeCN)_2/SeCN^-$, a cobalt-based electrolyte, and so forth as described in Non-patent Documents 1 and 2 and Patent Document 2 below. Patent Document 3 below discloses the study on dyes for use in dye-sensitized solar cells containing a cobalt-based electrolyte.

CITATION LIST

Non-Patent Document

Non-Patent Document 1: *J. Phys. Chem. B: Appl.* vol. 105, 2001, pp 6867-6873
Non-Patent Document 2: *J. m. Chem. Soc.*, vol. 124, 2001, pp. 11215-11222

Patent Document

Patent Document 1: US 2008236663A1
Patent Document 2: JP 2005-353289A
Patent Document 3: JP 2013-077449A

SUMMARY OF THE INVENTION

Technical Problem

An object of the invention is to provide a dye-sensitized solar cell having high photoelectric efficiency and high durability.

Solution to Problem

As a result of extensive investigations, the inventors have found that the above object is accomplished by applying, to a dye-sensitized solar cell using an iodine-free electrolyte, a working electrode having a specific cyanine dye supported thereon and reached the present invention.

The invention provides:

<1> A dye-sensitized solar cell comprising a working electrode and a counter electrode facing each other with an electrolyte layer therebetween, the working electrode having a dye-supporting metal oxide electrode comprising a metal oxide layer and a dye supported on the metal oxide layer, the dye comprising a cyanine dye, and the electrolyte of the electrolyte layer comprising a cobalt-based electrolyte.

<2> The dye-sensitized solar cell according to <1>, wherein the cyanine dye is at least one compound represented by general formula (1):

wherein A represents a group selected from group I consisting of (a) to (m); A' represents a group selected from group II consisting of (a') to (m');

Q represents a linking group constituting a methine chain having 1 to 9 carbon atoms and optionally containing a cyclic structure in the methine chain, the hydrogen atom of the methine chain being optionally replaced with a hydroxyl group, a halogen atom, a cyano group, —NRR', an aryl group, an arylalkyl group, or an alkyl group, the —NRR', aryl, arylalkyl, and alkyl groups being optionally substituted by a hydroxyl group, a halogen atom, a cyano group, or —NRR' and optionally interrupted by —O—, —S—, —CO—, —COO—, —OCO—, —SO$_2$—, —NH—, —CONH—, —NHCO—, —N=CH—, or —CH=CH—; wherein R and R' represents an aryl group, an arylalkyl group, or an alkyl group; and $An^{q-}$ represents a q-valent anion, wherein q represents 1 or 2, and p represents a coefficient for maintaining overall charge neutrality.

Group I

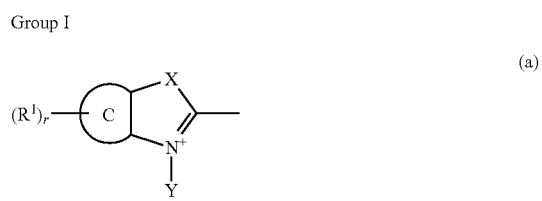

(a)

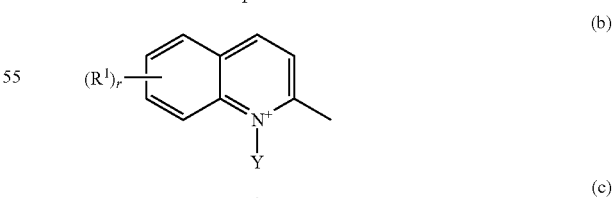

(b)

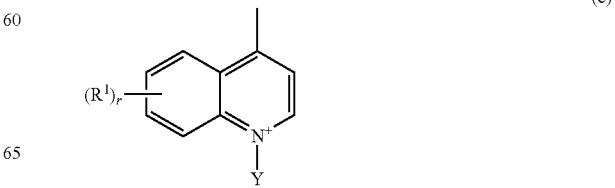

(c)

-continued
(d)
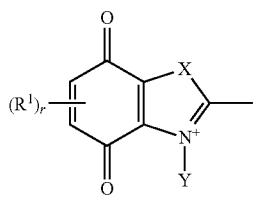
(e)
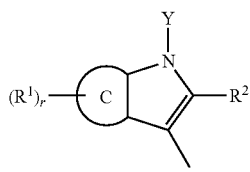
(f)
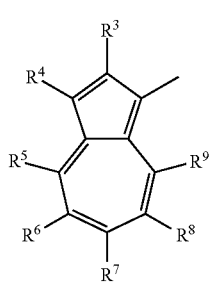
(g)
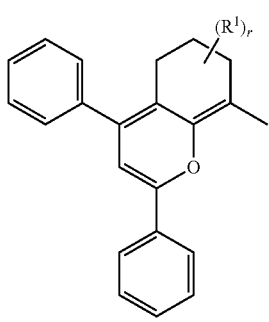
(h)
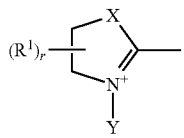
(i)
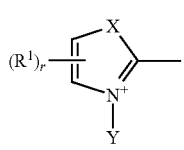
(j)
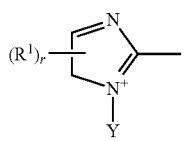
(k)
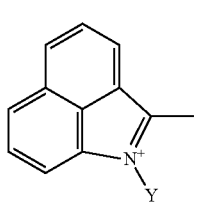
-continued
(l)
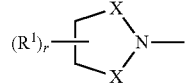
(m)
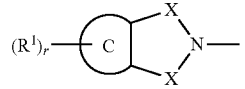
Group II
(a')
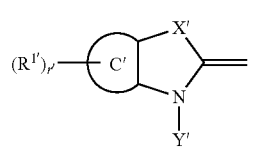
(b')
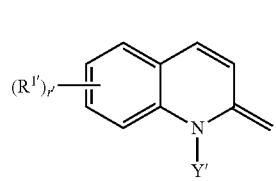
(c')
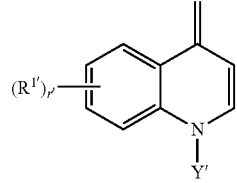
(d')
(e')
(f')

-continued (g') 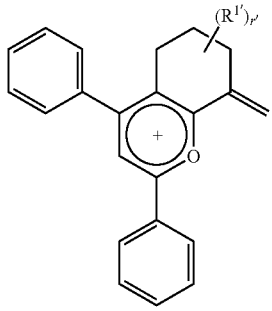

(h') 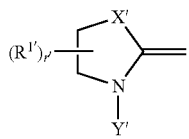

(i') 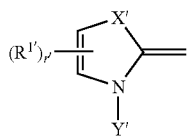

(j') 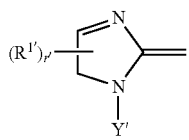

(k') 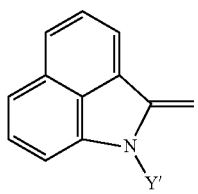

(l') 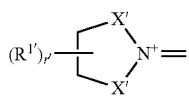

(m') 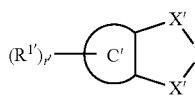

wherein ring C and ring C' each represent a benzene ring, a naphthalene ring, a phenanthrene ring, or a pyridine ring;

$R^1$ and $R^{1'}$ each represent a hydroxyl group, a halogen atom, a nitro group, a cyano group, a sulfo group, a phosphate group, a carboxyl group, an amino group, an amido group, a ferrocenyl group, an aryl group having 6 to 30 carbon atoms, an arylalkyl group having 7 to 30 carbon atoms, or an alkyl group having 1 to 8 carbon atoms, the C6-C30 aryl, C7-C30 arylalkyl, and C1-C8 alkyl groups being optionally substituted by a hydroxyl group, a halogen atom, a nitro group, a cyano group, a sulfo group, a phosphate group, a carboxyl group, an amino group, an amido group, or a ferrocenyl group and optionally interrupted by —O—, —S—, —CO—, —COO—, —OCO—, —SO$_2$—, —NH—, —CONH—, —NHCO—, —N=CH—, or —CH=CH—;

$R^2$, $R^3$, $R^4$, $R^5$, $R^6$, $R^7$, $R^8$, $R^9$, $R^{2'}$, $R^{3'}$, $R^{4'}$, $R^{5'}$, $R^{6'}$, $R^{7'}$, $R^{8'}$, and $R^{9'}$ each have the same meaning as $R^1$ and $R^{1'}$ or represents a hydrogen atom;

X and X' each represent an oxygen atom, a sulfur atom, a selenium atom, —CR$^{51}$R$^{52}$—, a cycloalkane-1,1-diyl group having 3 to 6 carbon atoms, —NH—, or —NY$^2$—, wherein R$^{51}$ and R$^{52}$ each have the same meaning as $R^1$ and $R^{1'}$ or represent a hydrogen atom;

Y, Y', and Y$^2$ each represent a hydrogen atom, an alkyl group having 1 to 20 carbon atoms, an aryl group having 6 to 30 carbon atoms, or an arylalkyl group having 7 to 30 carbon atoms, the alkyl, aryl, and arylalkyl groups being optionally substituted by a hydroxyl group, a halogen atom, a cyano group, a carboxyl group, an amino group, an amido group, a ferrocenyl group, a sulfo group, a phosphate group, —SiR$^6$R$^7$R$^8$, or a nitro group, the methylene moiety of the alkyl, aryl, or arylalkyl group as Y, Y', and Y$^2$ being optionally interrupted by —O—, —S—, —CO—, —COO—, —OCO—, —SO$_2$—, —NH—, —CONH—, —NHCO—, —N=CH—, or —CH=CH—; and r and r' each represent a number of from 0 to the maximum number of possible substituents in (a) to (e), (g) to (j), (l), (m), (a') to (e'), (g') to (j'), (l'), and (m').

<3> The dye-sensitized solar cell according to <2>, wherein the compound represented by general formula (1) is a compound in which Q is represented by any one of (Q-1) to (Q-11):

(Q-1) 

(Q-2) 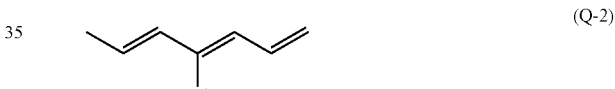

(Q-3) 

(Q-4) 

(Q-5) 

(Q-6) 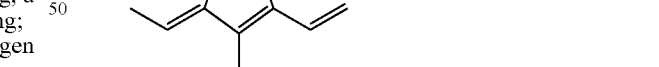

(Q-7) 

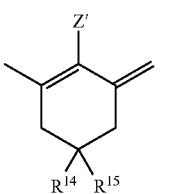

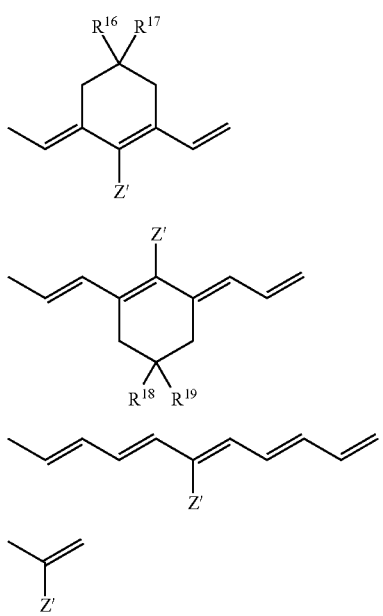

(Q-8)

(Q-9)

(Q-10)

(Q-11)

wherein $R^{14}$, $R^{15}$, $R^{16}$, $R^{17}$, $R^{18}$, $R^{19}$, and Z' each independently represent a hydrogen atom, a hydroxyl group, a halogen atom, a cyano group, —NRR', an aryl group, an arylalkyl group, or an alkyl group,
the —NRR', aryl, arylakyl, and alkyl groups being optionally substituted by a hydroxyl group, a halogen atom, a cyano group, or —NRR' and optionally interrupted by —O—, —S—, —CO—, —COO—, —OCO—, —SO$_2$—, —NH—, —CONH—, —NHCO—, —N=CH—, or —CH=CH—; and R and R' each represent an aryl group, an arylalkyl group, or an alkyl group.

<4> The dye-sensitized solar cell according to <2> or <3>, wherein the compound represented by general formula (1) is a compound having one or two groups selected from (a) to (e), (h) to (m), (a') to (e'), and (h') to (m').

<5> The dye-sensitized solar cell according to any one of <2> to <4>, wherein the compound represented by general formula (1) is a compound in which A is a group selected from (a) and (h) to (k); A' is a group selected from (a') and (h') to (k'); Q is a linking group constituting a methine chain having 1, 3, 5, or 7 carbon atoms and optionally containing a cyclic structure, the hydrogen atom of the methine chain being optionally replaced with a hydroxyl group, a halogen atom, a cyano group, —NRR', an aryl group, an arylalkyl group, or an alkyl group; the —NRR', aryl, arylakyl, and alkyl group being optionally substituted by a hydroxyl group, a halogen atom, a cyano group, or NRR' and optionally interrupted by —O—, —S—, —CO—, —COO—, —OCO—, —SO$_2$—, —NH—, —CONH—, —NHCO—, —N=CH—, or —CH=CH—; and R and R' are each an aryl group, an arylalkyl group, or an alkyl group.

Effect of the Invention

The invention has realized a dye-sensitized solar cell in which the sensitizing dye exhibits a broad absorption wavelength range, excellent absorptivity onto (adhesion to) a metal oxide layer, and high energy transfer efficiency.

DESCRIPTION OF EMBODIMENTS

The invention will be described based on its preferred embodiments.

The dye-sensitized solar cell of the invention may be structurally the same as conventional dye-sensitized solar cells except for using an electrolyte other than an iodine/iodide ion couple and a cyanine compound as a sensitizing dye. A typical structure of the dye-sensitized solar cell according to the invention will be illustrated by way of FIGS. 1 and 2.

Figure 1:
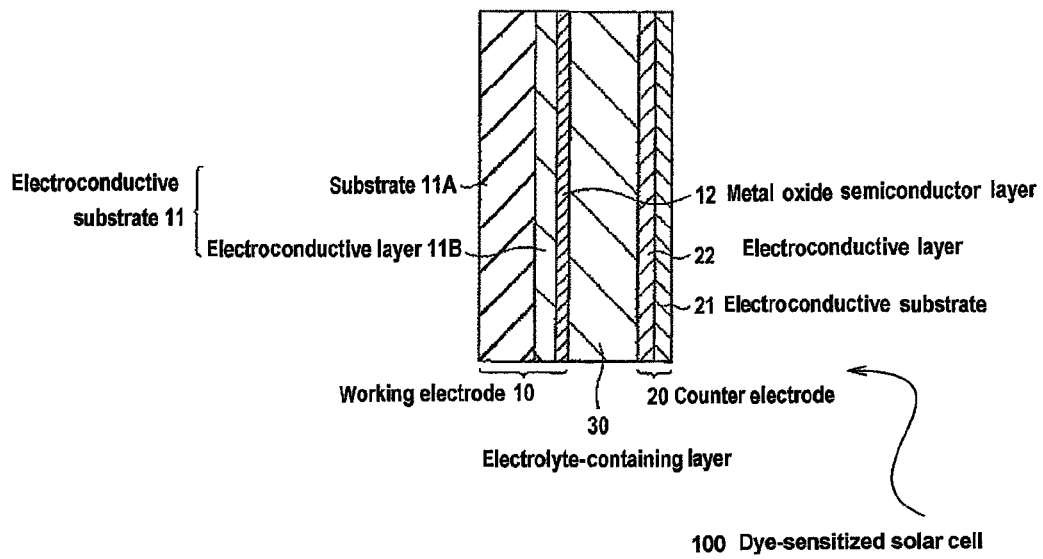
FIG. 1 schematically illustrates a cross-sectional structure of a dye-sensitized solar cell according to the invention.
Figure 2:
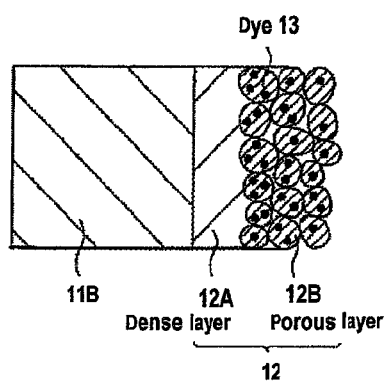
FIG. 2 is an enlarged view of the essential part of the dye-sensitized solar cell of the invention shown in FIG. 1.

FIG. 1 is a schematic illustration of the structure of a dye-sensitized solar cell according to the invention, and FIG. 2 is an enlarged view of the essential part of the dye-sensitized solar cell shown in FIG. 1. The dye-sensitized solar cell includes a working electrode 10 and a counter electrode 20 facing each other with an electrolyte-containing layer 30 therebetween. At least one of the working electrode 10 and the counter electrode 20 is light-transmissive.

The working electrode 10 has, for example, an electroconductive substrate 11, a metal oxide semiconductor layer 12 provided on one side of the substrate 11 (on the side facing the counter electrode 20), and a dye 13 supported on the metal oxide semiconductor layer 12. In the solar cell of the invention, the dye 13 contains at least one cyanine dye, and the electrolyte of the electrolyte-containing layer 30 contains at least one member selected from a quinone/hydroquinone electrolyte, $(SCN)_2/SCN^-$, $(SeCN)_2/SeCN^-$, a cobalt-based electrolyte, and a nitroxyl radical compound-based electrolyte. In the example shown in FIG. 1, a composite system (carrier system) composed of the metal oxide semiconductor layer 12 (a carrier for the dye 13) and the dye 13 supported thereon corresponds to the dye-supporting metal oxide electrode.

The working electrode 10 functions as a negative electrode of an outer circuit. The electroconductive substrate 11 is, for example, composed of an insulating substrate 11A and an electroconductive layer 11B formed on the surface of the insulating substrate 11A.

Suitable materials of the substrate 11A include insulating materials, such as glass and plastics. Plastics are used in the form of transparent polymer film. The plastics include tetraacetyl cellulose (TAC), polyethylene terephthalate (PET), polyethylene naphthalate (PEN), syndiotactic polystyrene (SPS), polyphenylene sulfide (PPS), polycarbonate (PC), polyarylate (PAR), polysulfone (PSF), polyester sulfone (PES), polyetherimide (PEI), cyclic polyolefins, and brominated phenoxy resins.

The electroconductive layer 11B is exemplified by a thin film of an electroconductive metal oxide, such as indium oxide, tin oxide, indium-tin complex oxide (ITO), or fluorine-doped tin oxide (FTO or F—SnO$_2$), a thin film or mesh of a metal, such as gold (Au), silver (Ag), or platinum (Pt), or an electro conductive polymer film.

The electroconductive substrate 11 may be a monolithic structure made of an electroconductive material. In that case, examples of the material of the electro conductive substrate 11 include electro conductive metal oxides, such as indium oxide, tin oxide, indium-tin complex oxide, or fluorine-doped tin oxide, metals, such as gold, silver, or platinum, and electro conductive polymers.

The metal oxide semiconductor layer 12 is a carrier for supporting the dye 13. It has, for example, a porous structure as illustrated in FIG. 2. The metal oxide semiconductor layer 12 is formed of a dense layer 12A and a porous layer 12B. The dense layer 12A is formed on the interface between the electroconductive substrate 11 and the metal oxide semiconductor layer 12 and is preferably dense and void-free, more preferably filmy. The porous layer 12B is formed on the surface in contact with the electrolyte-containing layer 30. It preferably has a structure with many voids and a large surface area, more preferably a structure composed of porous particles adhering to one another. The metal oxide semiconductor layer 12 may have a single layer structure of film form. As used herein, the term "supported" used for the dye 13 means a state in which the dye 13 is bonded or adsorbed to the porous layer 12B chemically, physically, or electrically.

Examples of the material (metal oxide semiconductor material) contained in the metal oxide semiconductor layer 12 include titanium oxide, zinc oxide, tin oxide, niobium oxide, indium oxide, zirconium oxide, tantalum oxide, vanadium oxide, yttrium oxide, aluminum oxide, and magnesium oxide. Preferred of them are titanium oxide and zinc oxide; for they provide high conversion efficiency. These metal oxide semiconductor materials may be used either individually or in combination of two or more thereof in the form, e.g., of mixture, mixed crystal, solid solution, or one on surface of another. For example, titanium oxide and zinc oxide may be used in combination.

The metal oxide semiconductor layer 12 having a porous structure can be formed by, for example, electrodeposition, coating, or firing. Electrodeposition to form the metal oxide semiconductor layer 12 is carried out by immersing the electroconductive substrate 11 in an electrolytic bath containing a particulate metal oxide semiconductor material to cause the particles to adhere to and precipitate on the electroconductive layer 11B of the electro conductive substrate 11. In the case of the coating method, a dispersion of a particulate metal oxide semiconductor material (metal oxide slurry) is applied to the electroconductive substrate 11 and then dried to remove the dispersing medium. In the case of the sintering method, the metal oxide slurry is applied to the electroconductive substrate 11 and dried in the same manner as in the coating method, followed by firing. The electrodeposition or coating method is advantageous in that a less heat-resistant plastic material or polymer film material is allowed to be used to form the substrate 11A thereby making it possible to provide a highly flexible electrode.

The metal oxide semiconductor layer 12 may be treated with an organic base, a urea derivative, or a cyclic saccharide chain. Examples of the organic base include diarylamines, triarylamines, pyridine, 4-t-butylpyridine, polyvinylpyridine, quinoline, piperidine, and amidines. The treatment may be effected either before or after the hereinafter described adsorption of the dye 13. The treatment may be carried out by immersion. In using a solid treating agent, the treating agent is dissolved in an organic solvent to prepare a solution, in which the metal oxide semiconductor layer 12 is immersed.

The dye 13 is, for example, in a state adsorbed onto the metal oxide semiconductor layer 12. The dye 13 includes at least one dye (sensitizing dye) capable of being excited on absorbing incident light and injecting electrons to the metal oxide semiconductor layer 12. In the solar cell of the invention, the dye 13 contains at least one cyanine dye.

It is only necessary for the dye 13 to contain at least one cyanine dye. That is, the dye 13 may contain other dyes as long as the effects of the invention are not impaired.

While the cyanine dye used as the dye 13 is not particularly limited, it is preferred to use at least one cyanine dye represented by general formula (1) above.

In general formula (1), examples of the halogen atom as represented by $R^1$ through $R^9$, $R^{1'}$ through $R^{9'}$, and $R^{51}$ and $R^{52}$ in X and X' include fluorine, chlorine, bromine, and iodine. Examples of the C6-C30 aryl group include phenyl, naphthyl, 2-methylphenyl, 3-methylphenyl, 4-methylphenyl, 4-vinylphenyl, 3-isopropylphenyl, 4-isopropylphenyl, 4-butylphenyl, 4-isobutylphenyl, 4-t-butylphenyl, 4-hexylphenyl, 4-cyclohexylphenyl, 4-octylphenyl, 4-(2-ethylhexyl)phenyl, 4-stearylphenyl, 2,3-dimethylphenyl, 2,4-dimethylphenyl, 2,5-dimethylphenyl, 2,6-dimethylphenyl, 3,4-dimethylphenyl, 3,5-dimethylphenyl, 2,4-di-t-butylphenyl, 2,5-di-t-butylphenyl, 2,6-di-t-butylphenyl, 2,4-di-t-pentylphenyl, 2,5-di-t-amylphenyl, 2,5-di-t-octylphenyl, 2,4-di-cumylphenyl, 4-cyclohexylphenyl, (1,1'-biphenyl)-4-yl, 2,4,5-trimethylphenyl, and ferrocenyl.

Examples of the C7-C30 arylalkyl group include benzyl, phenethyl, 2-phenylpropan-2-yl, diphenylmethyl, triphenylmethyl, styryl, cinnamyl, ferrocenylmethyl, and ferrocenylpropyl.

Examples of the C1-C8 alkyl group include methyl, ethyl, propyl, isopropyl, butyl, sec-butyl, tert-butyl, isobutyl, amyl, isoamyl, tert-amyl, hexyl, 2-hexyl, 3-hexyl, cyclohexyl, 1-methylcyclohexyl, heptyl, 2-heptyl, 3-heptyl, isoheptyl, tert-heptyl, 1-octyl, isooctyl, and tert-octyl.

The C6-C30 aryl group, C7-C30 arylakyl, and the C1-C8 alkyl group may be substituted by a hydroxyl group, a halogen atom, a nitro group, a cyano group, a sulfo group, a phosphate group, a carboxyl group, an amino group, an amido group, or a ferrocenyl group and may be interrupted by —O—, —S—, —CO—, —COO—, —OCO—, —SO$_2$—, —NH—, —CONH—, —NHCO—, —N=CH—, or a double bond. The number and positions of substitutions and interruptions are discretionary. Note that the number of carbon atoms recited herein as for an atomic group does not include the number of carbon atoms of a substituent or an interrupting group, if any, unless otherwise specified.

Examples of the C1-C8 alkyl group substituted with halogen include chloromethyl, dichloromethyl, trichloromethyl, fluoromethyl, difluoromethyl, trifluoromethyl, and nonafluorobutyl.

Examples of the C1-C8 alkyl group interrupted by —O— include alkoxy groups, such as methoxy, ethoxy, isopropoxy, propoxy, butoxy, pentyloxy, isopentyloxy, hexyloxy, heptyloxy, octyloxy, and 2-ethylhexyloxy; and alkoxyalkyl groups, such as 2-methoxyethyl, 2-(2-methoxy)ethoxyethyl, 2-ethoxyethyl, 2-butoxyethyl, 4-methoxybutyl, and 3-methoxybutyl.

Examples of the C1-C8 alkyl group substituted with halogen and interrupted by —O— include chloromethoxy, dichloromethoxy, trichloromethoxy, fluoromethoxy, difluoromethoxy, trifluoromethoxy, and nonafluorobutoxy.

Examples of the C3-C6 cycloalkane-1,1-diyl group as represented by X and X' in formula (1) include cyclopropane-1,1-diyl, cyclobutane-1,1-diyl, 2,4-dimethylcyclobutane-1,1-diyl, 3,3-dimethylcyclobutane-1,1-diyl, cyclopentane-1,1-diyl, and cyclohexane-1,1-diyl.

In formula (1), examples of the halogen atom, C1-C20 alkyl group, C6-C30 aryl group, and C7-C30 arylalkyl group as represented by Y, Y', and $Y^2$ are the same as those recited above as for $R^1$. One or more of the hydrogen atoms of these groups may optionally be replaced with a hydroxyl group, a halogen atom, a cyano group, a carboxyl group, an amino group, an amido group, a ferrocenyl group, a sulfo group, a phosphate group, —SiR$^6$R$^7$R$^8$, or a nitro group.

The methylene moiety of the alkyl, aryl, or arylalkyl group as Y, Y', and $Y^2$ may be interrupted by —O—, —S—, —CO—, —COO—, —OCO—, —SO$_2$—, —NH—, —CONH—, —NHCO—, —N=CH—, or —CH=CH—. For example, the alkyl group (e.g., methyl, ethyl, propyl, isopropyl, butyl, sec-butyl, tert-butyl, isobutyl, amyl, isoamyl, tert-amyl, hexyl, 2-hexyl, 3-hexyl, cyclohexyl, 1-methylcyclohexyl, heptyl, 2-heptyl, 3-heptyl, isoheptyl, tert-heptyl, 1-octyl, isooctyl, tert-octyl, 2-ethylhexyl, nonyl, isononyl, decyl, dodecyl, tridecyl, tetradecyl, pentadecyl, hexadecyl, heptadecyl, or octadecyl), the aryl group (e.g., phenyl, naphthyl, 2-methylphenyl, 3-methylphenyl, 4-methylphenyl, 4-vinylphenyl, 3-isopropylphenyl, 4-isopropylphenyl, 4-butylphenyl, 4-isobutylphenyl, 4-tert-butylphenyl, 4-hexylphenyl, 4-cyclohexylphenyl, 4-octylphenyl, 4-(2-ethylhexyl)phenyl, 4-stearylphenyl, 2,3-dimethylphenyl, 2,4-dimethylphenyl, 2,5-dimethylphenyl, 2,6-dimethylphenyl, 3,4-dimethylphenyl, 3,5-dimethylphenyl, 2,4-di-tert-butylphenyl, or cyclohexylphenyl), and the arylalkyl group (e.g., benzyl, phenethyl, 2-phenylpropan-2-yl, diphenylmethyl, triphenylmethyl, styryl, or cinnamyl) may be interrupted by an ether linkage, a thioether linkage, and the like. Examples of such interrupted groups are 2-methoxyethyl, 3-methoxypropyl, 4-methoxybutyl, 2-butoxyethyl, methoxyethoxyethyl, methoxyethoxyethoxyethyl, 3-methoxybutyl, 2-phenoxyethyl, 3-phenoxypropyl, 2-methylthioethyl, and 2-phenylthioethyl.

The anion represented by $An^{q-}$ in general formula (1) is exemplified by organic sulfonate anions, which are sulfonate anions having an organic group. Examples of the organic group include an alkyl group, e.g., methyl, ethyl, propyl, butyl, or cyclohexyl, an aryl group, e.g., phenyl or naphthyl, and a heterocyclic group, such as thienyl or pyrrolyl. The alkyl, aryl, and heterocyclic groups may optionally be substituted with a halogen atom, a carboxyl group, a hydroxyl group, an alkyl group, an alkoxy group, and so on. The organic sulfonate anions may be monovalent, divalent, or trivalent.

Examples of the monovalent organic sulfonate anion include methanesulfonate, dodecylsulfonate, benzenesulfonate, toluenesulfonate, trifluoromethanesulfonate, naphthalenesulfonate, diphenylamine-4-sulfonate, 2-amino-4-methyl-5-chlorobenzenesulfonate, 2-amino-5-nitrobenzenesulfonate, and the sulfonates described in JP 10-235999A, JP 10-337959A, JP 11-102088A, JP 2000-108510A, JP 2000-168223A, JP 2001-209969A, JP 2001-322354A, JP 2006-248180A, JP 2006-297907, JP 8-253705A, JP 2004-503379A, JP 2005-336150A, and WO 2006/28006. Examples of the divalent organic sulfonate anions include benzenedisulfonate, naphthalenedisulfonate, naphthalene-1,5-disulfonate, 9,10-diethoxyanthracene-2,6-sulfonate, difluoromethanesulfonate, and tetrafluoroethanedisulfonate. Examples of trivalent organic sulfonate anion include naphthalene-1,3,6-trisulfonate and trifluoroethanetrisulfonate.

Further included in monovalent anions are halide anions, e.g., chloride, bromide, iodide, and fluoride; inorganic anions, such as perchlorate, chlorate, thiocyanate, hexafluorophosphate, hexafluoroantimonate, tetrafluoroborate, nitrate, and tetracyanoborate; organic phosphate anions, such as octylphosphate, dodecylphosphate, octadecylphosphate, phenylphosphate, nonylphenylphosphate, and 2,2'-methylenebis(4,6-di-t-butylphenyl)phosphonate; bistrifluoromethylsulfonylimide, bisperfluorobutanesulfonylimide, perfluoro-4-ethylcyclohexanesulfonate, tetrakis(pentafluorophenyl)borate, tris(fluoroalkylsulfonyl)carbanion, and dibenzoyltartrate.

The linking group as represented by Q in formula (1), which constitutes a C1-C9 methine chain optionally containing a cyclic structure, is preferably a group represented by any one of formulae (Q-1) through (Q-11) for ease of synthesis of the compound of formula (1). The number of 1 to 9 recited as the number of the carbon atoms of the methine chain does not include the number of carbon atoms of a substituent(s) on the methine chain or a cyclic structure of the methine chain (e.g., the carbon atoms on both terminals of the groups (Q-1) to (Q-11), and any carbon atoms if present in Z' and $R^{14}$ to $R^{19}$). The linking group Q is more preferably a group represented by formula (Q-1), (Q-2), (Q-6), or (Q-9) for ease of synthesis and suitable absorption wavelengths of the compound of formula (1).

Examples of the halogen atom, aryl group, arylalkyl group, and alkyl group as represented by $R^{14}$, $R^{15}$, $R^{16}$, $R^{17}$, $R^{18}$, $R^{19}$, and Z' are the same as those recited as for $R^1$. The aryl group, arylalkyl group, and alkyl group as represented by R and R' are the same as those recited as to $R^1$.

Of the compounds represented by general formula (1), preferred are those having one or two groups selected from (a) to (e), (h) to (m), (a') to (e'), and (h') to (m').

More preferred are those in which A is a group selected from (a) and (h) to (k); A' is a group selected from (a') and (h') to (k'); and Q is a linking group constituting a methine chain having 1, 3, 5, or 7 carbon atoms that may optionally contain a cyclic structure, the hydrogen atom of the methine chain being optionally replaced with a hydroxyl group, a halogen atom, a cyano group, —NRR', an aryl group, an arylalkyl group, or an alkyl group, wherein the —NRR', aryl, arylalkyl, and alkyl group may optionally be substituted by a hydroxyl group, a halogen atom, a cyano group, or NRR' and may optionally be interrupted by —O—, —S—, —CO—, —COO—, —OCO—, —SO$_2$—, —NH—, —CONH—, —NHCO—, —N=CH—, or —CH=CH—, and R and R' are each an aryl group, an arylalkyl group, or an alkyl group.

The compound of formula (1) in which Y, Y', and $Y^2$ are each a C1-C20 alkyl, C6-C30 aryl, or C7-C30 arylalkyl group each substituted by a carboxyl group, a sulfo group, a phosphate group, or $SiR^6R^7R^8$ is preferred for high adsorptivity onto the carrier. In particular, the compound in which Y and/or Y' is(are) a C1-C20 alkyl, C6-C30 aryl, or C7-C30 arylalkyl group each substituted by one or more carboxyl groups, more particularly, the compound in which Y and/or Y' is(are) a C1-C20 alkyl group substituted by one or more carboxyl groups, even more particularly the compound in which Y and/or Y' is(are) a C1-C5 alkyl group substituted by one or more carboxyl groups is preferred.

Examples of the cation of the compound represented by general formula (1) include, but are not limited to, cation Nos. 1 through 97 shown below. Further included are those of the cyanine dyes described in JP 2008-274230A, JP 2010-157373A, and WO 2010/038589. In the formulae below, Me is methyl; Et is ethyl; and Ph is phenyl.

No. 1

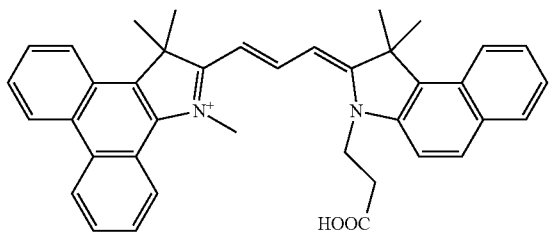

No. 2
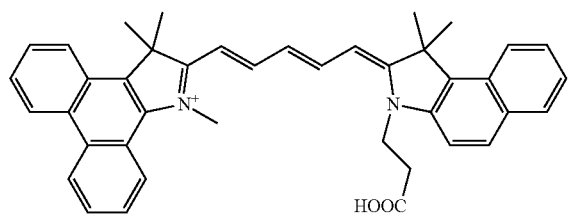
No. 3
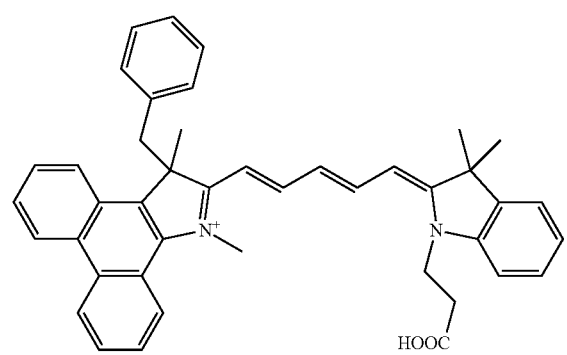
No. 4
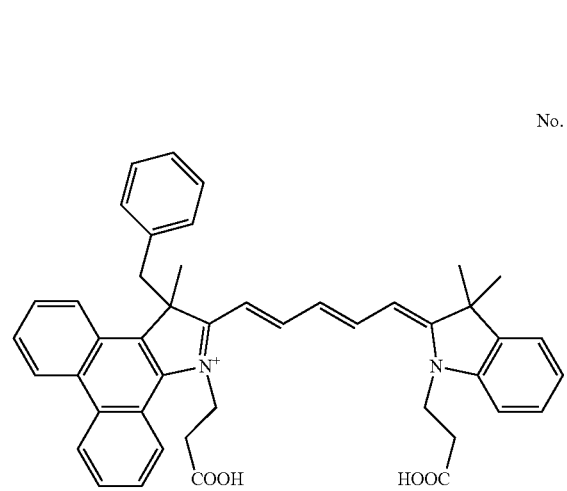
No. 5
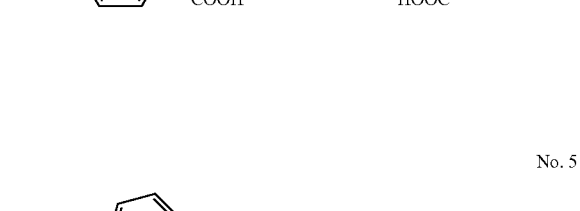
No. 6
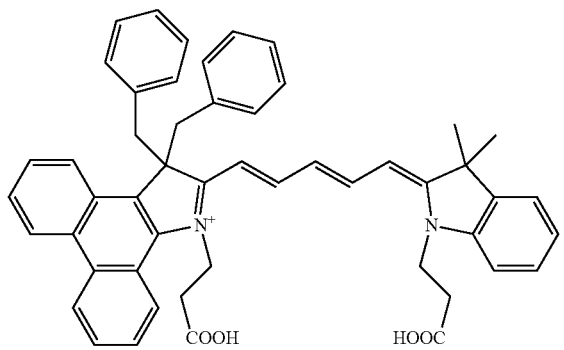
No. 7
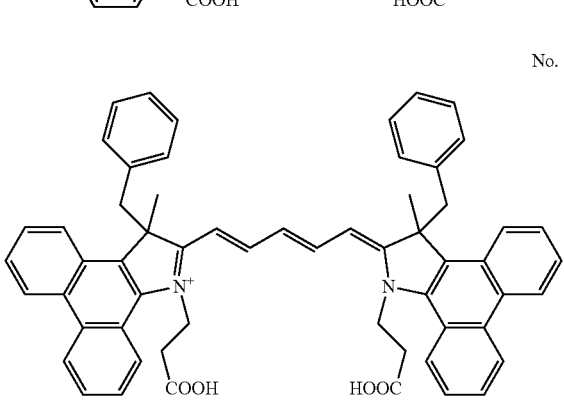
No. 8
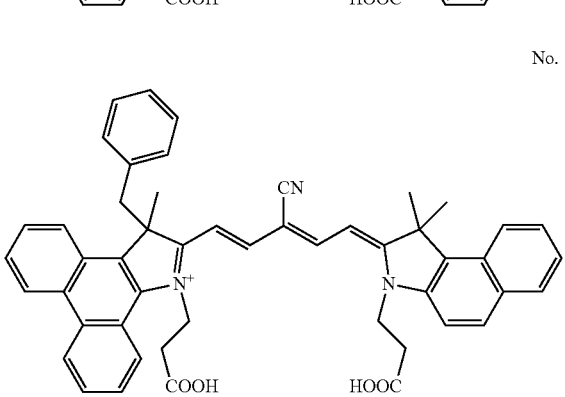
No. 9
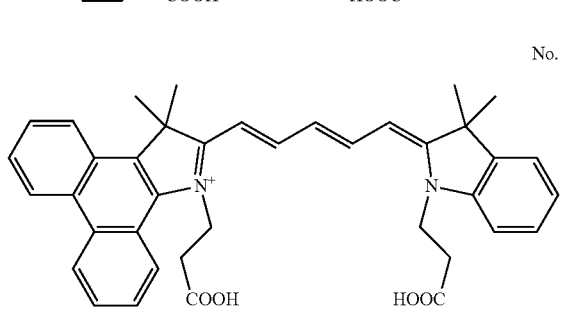
No. 10
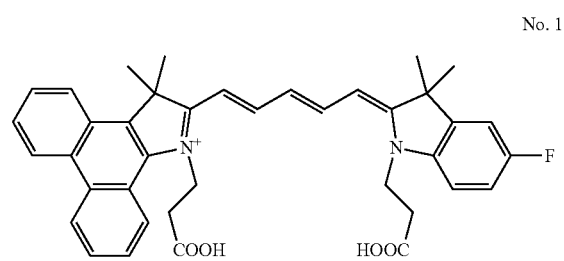

No. 11
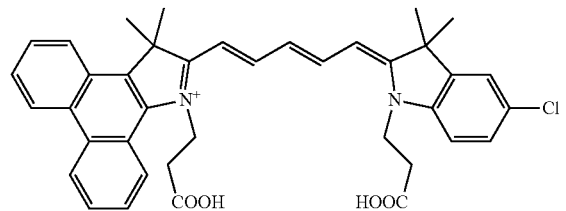
No. 12
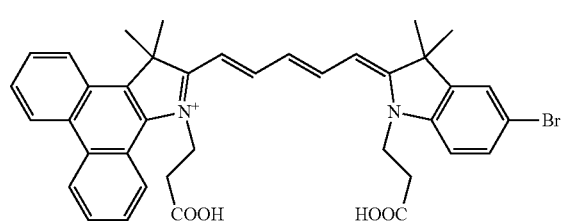
No. 13
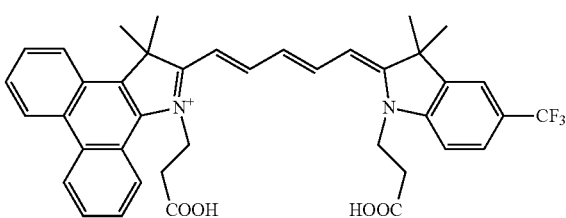
No. 14
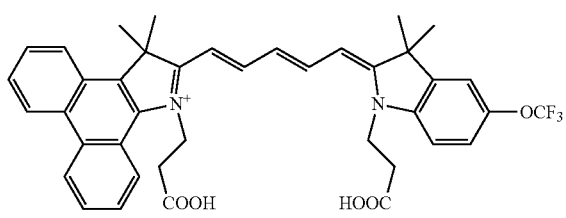
No. 15
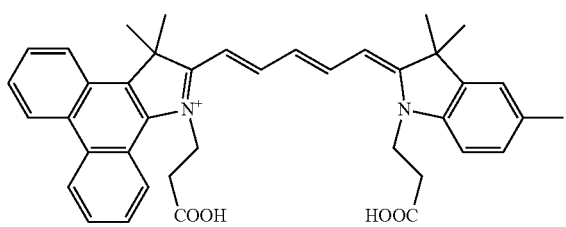
No. 16
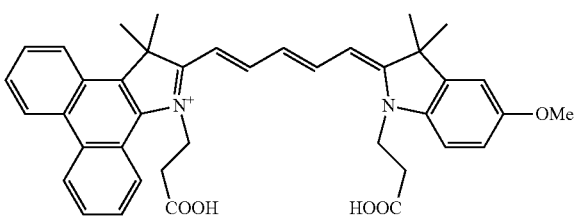
No. 17
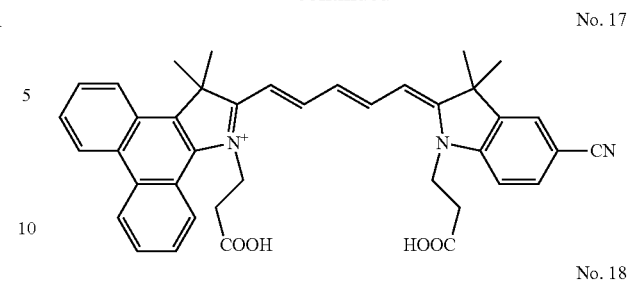
No. 18
No. 19
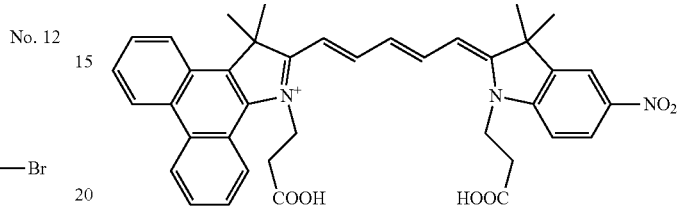
No. 20
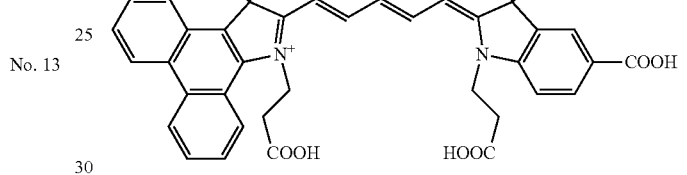
No. 21
No. 22
No. 23
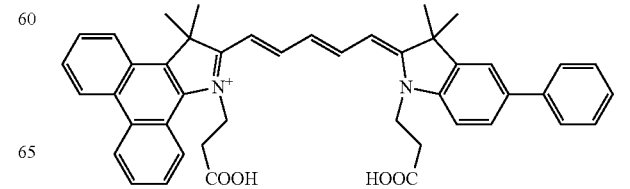

No. 24
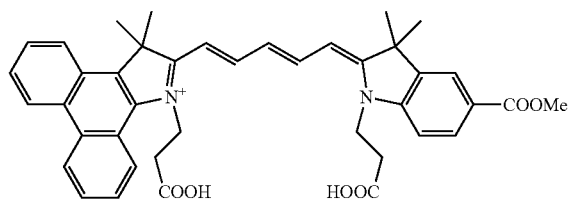
No. 30
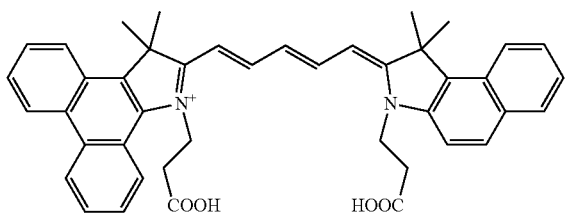
No. 25
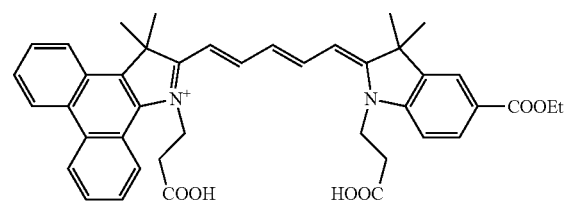
No. 31
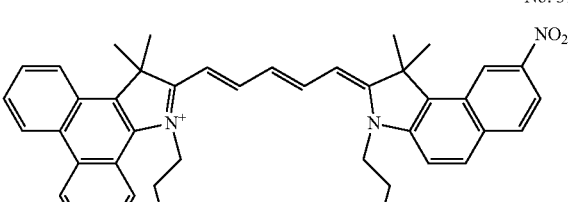
No. 26
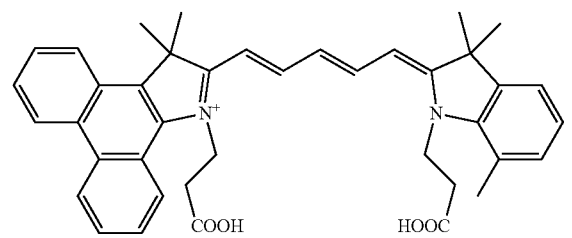
No. 32
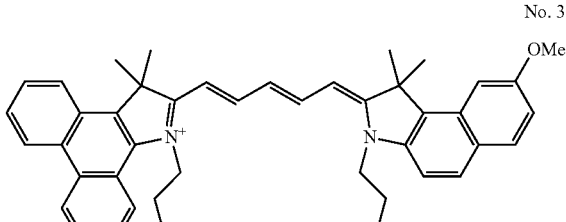
No. 27
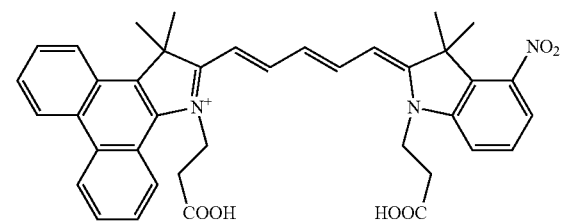
No. 33
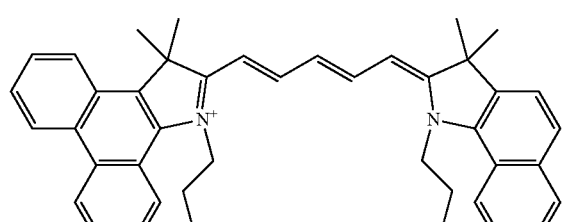
No. 28
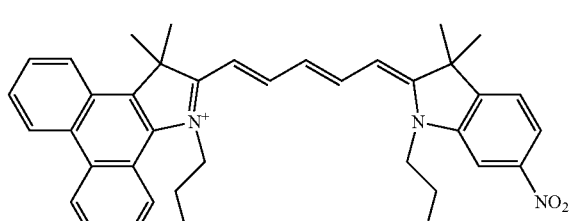
No. 34
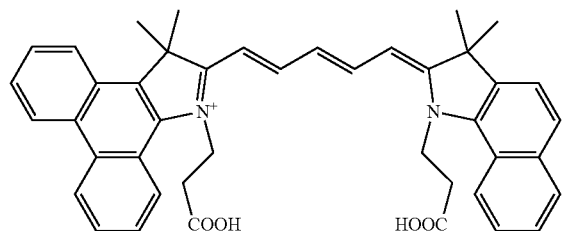
No. 29
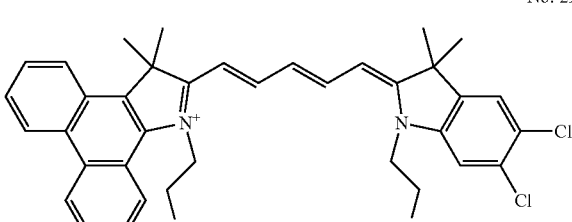
No. 35
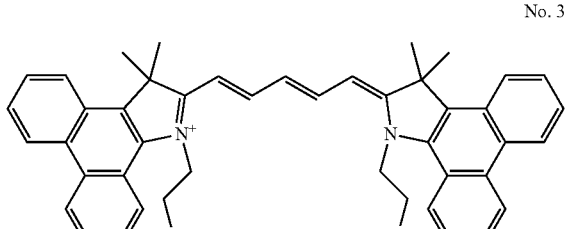

No. 36
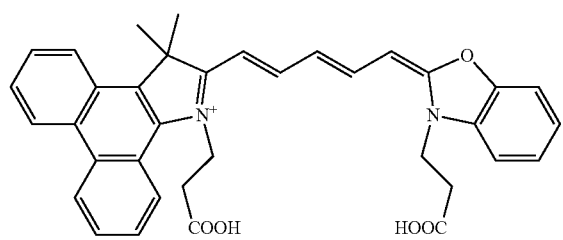
No. 37
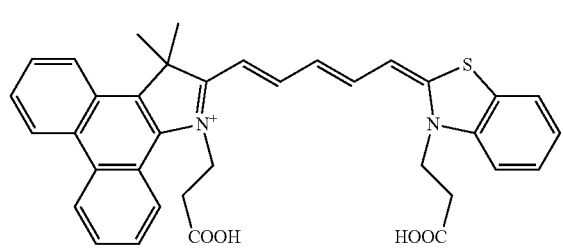
No. 38
No. 39
No. 40
No. 41
No. 42
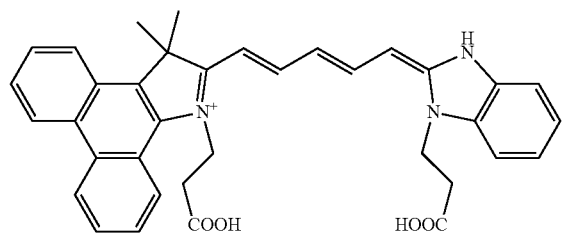
No. 43
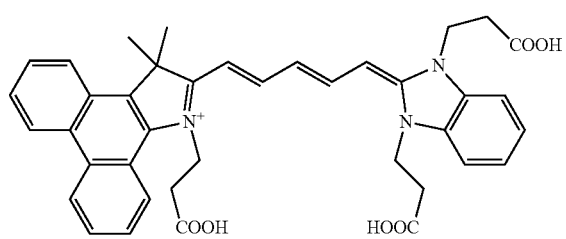
No. 44
No. 45
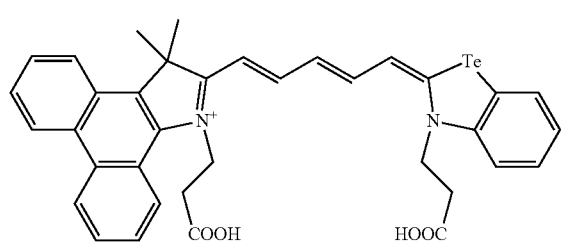
No. 46
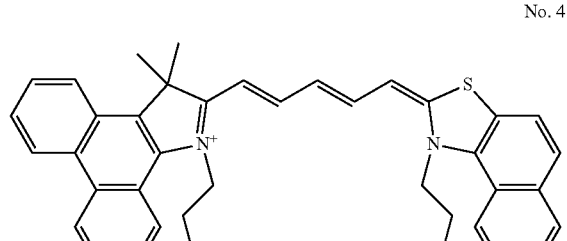
No. 47
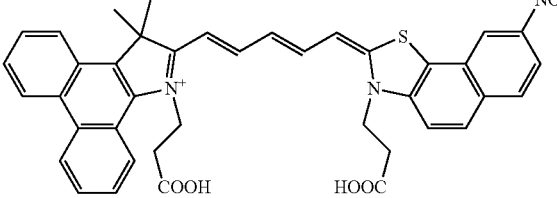

No. 48
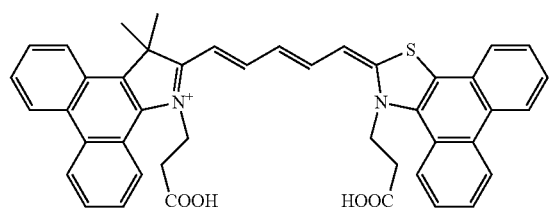
No. 49
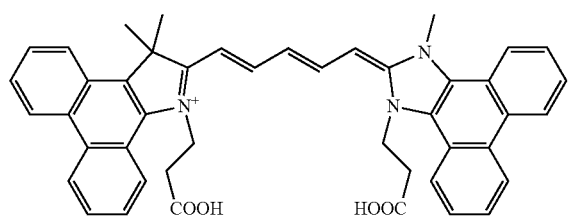
No. 50
No. 51
No. 52
No. 53
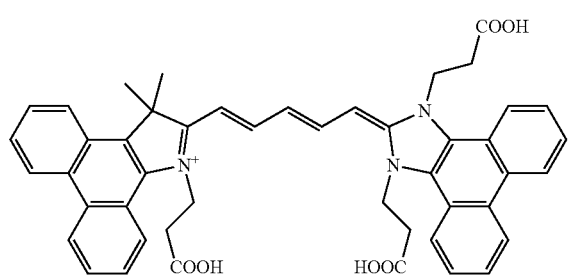
No. 54
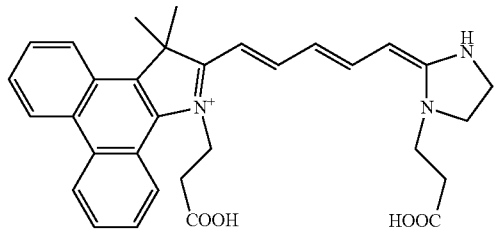
No. 55
No. 56
No. 57
No. 58
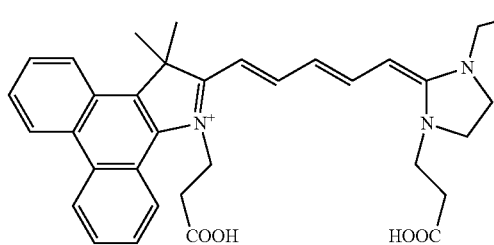

No. 59
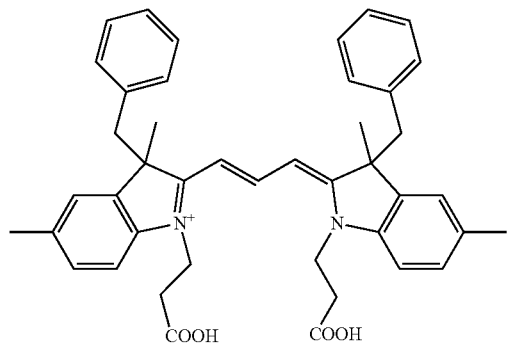
No. 60
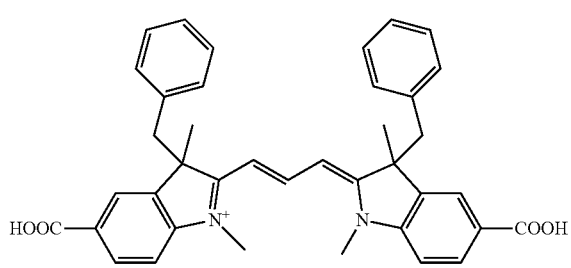
No. 61
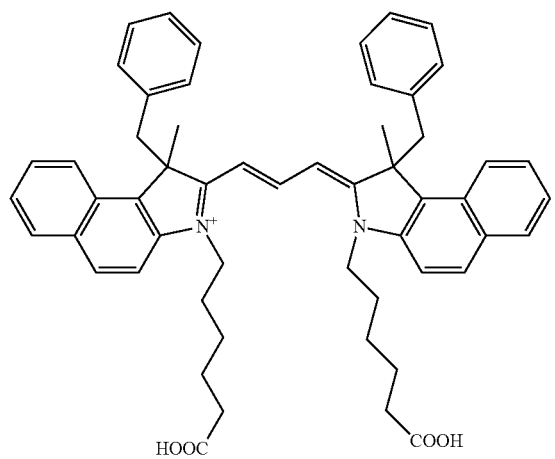
No. 62
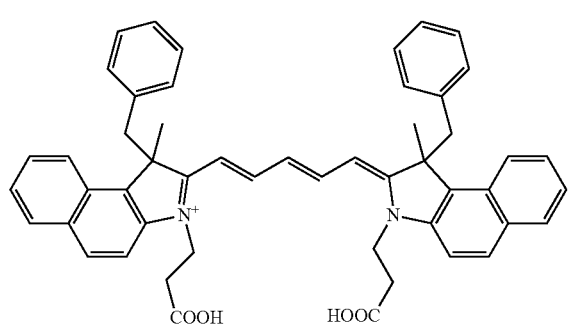
No. 63
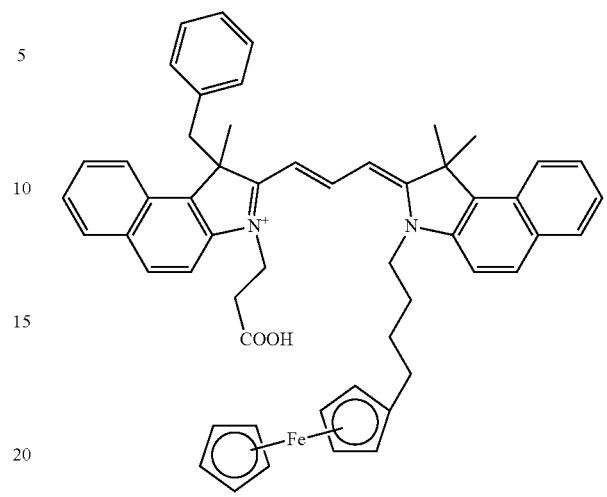
No. 64
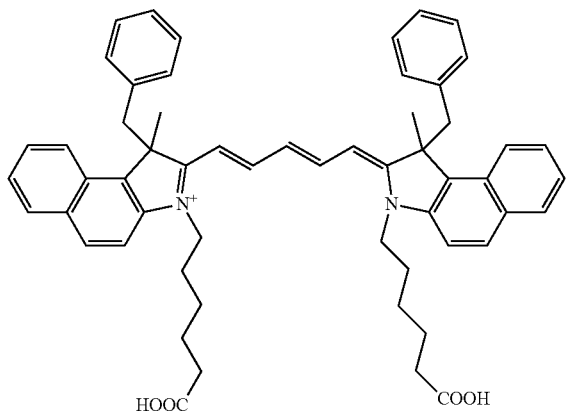
No. 65
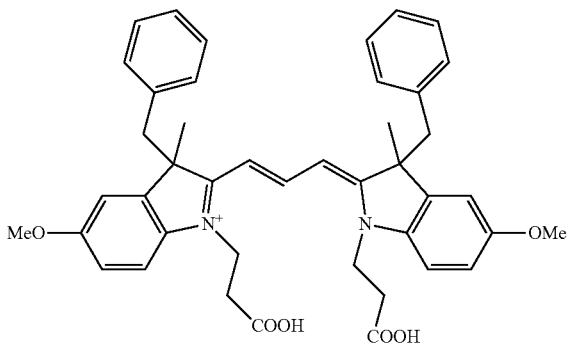

No. 66
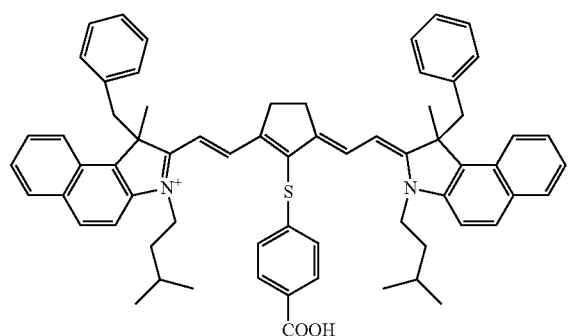
No. 71
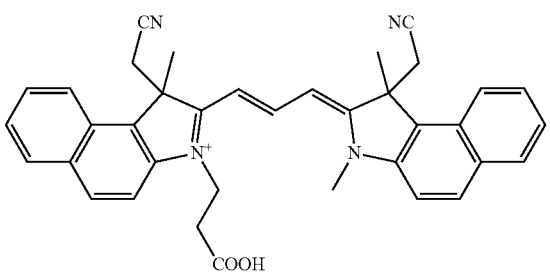
No. 67
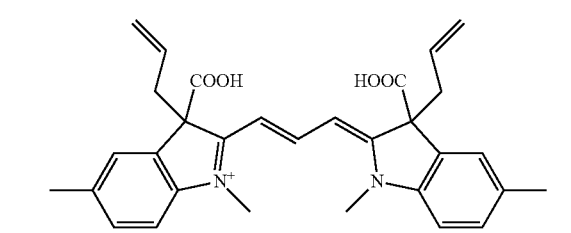
No. 72
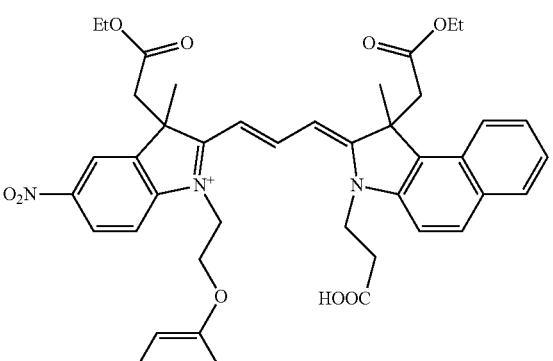
No. 68
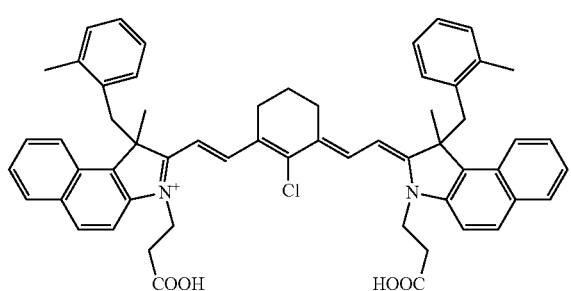
No. 73
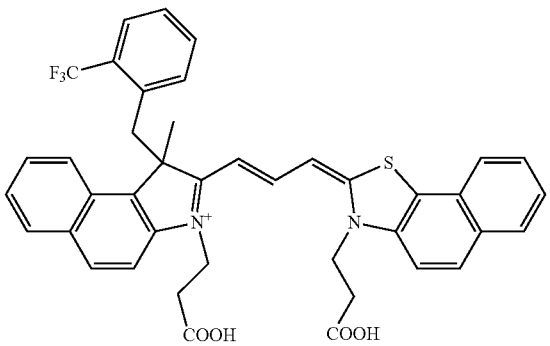
No. 69
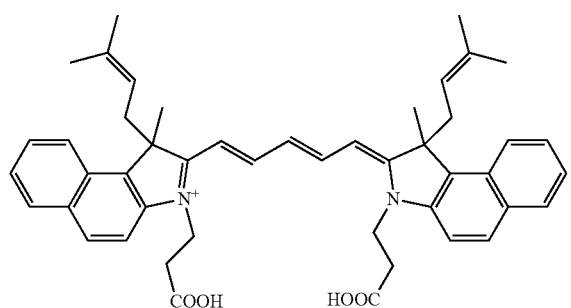
No. 74
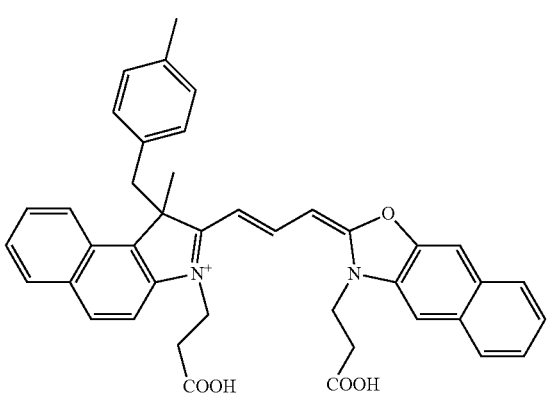
No. 70
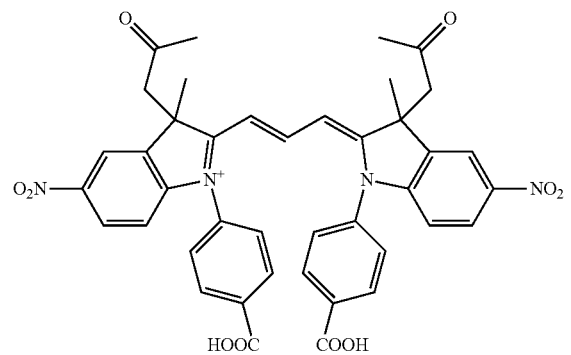

-continued
No. 75
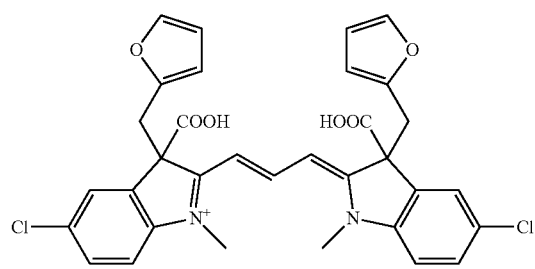
No. 76
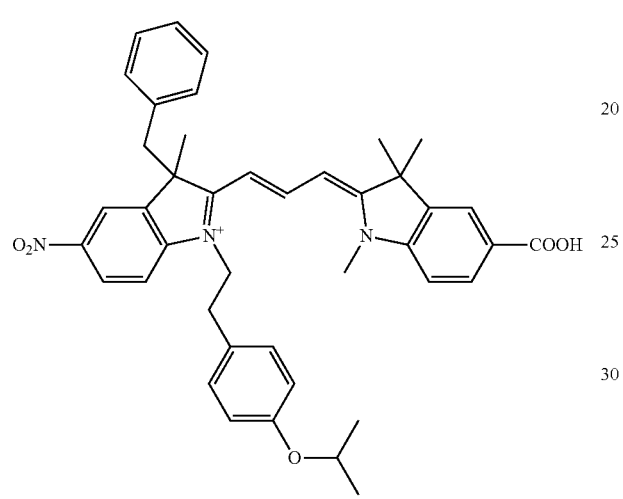
No. 77
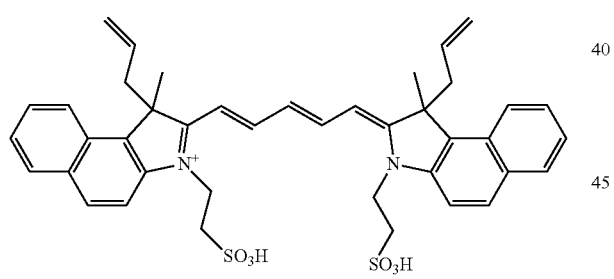
No. 78
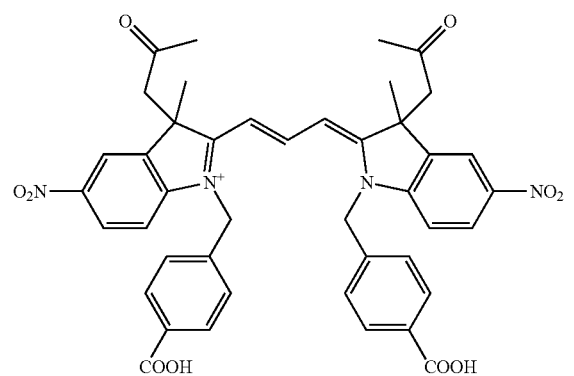
-continued
No. 79
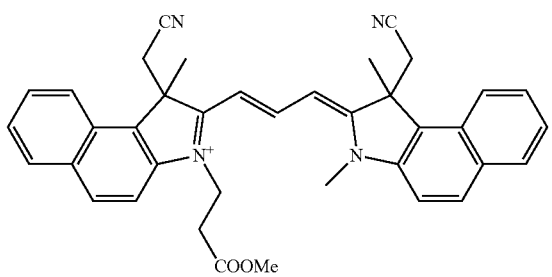
No. 80
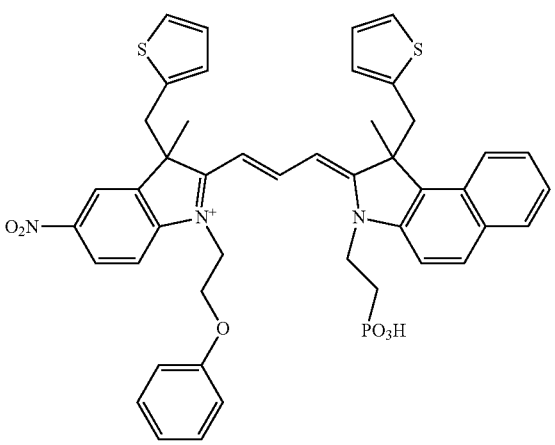
No. 81
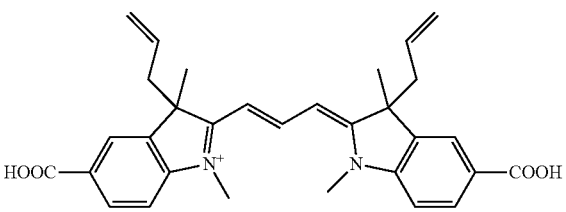
No. 82
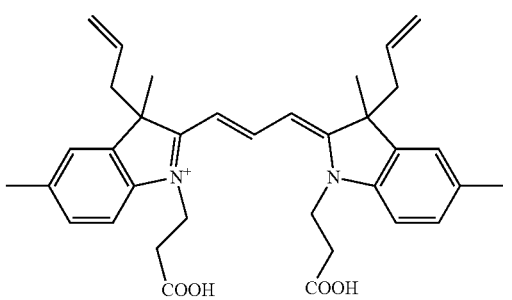
No. 83
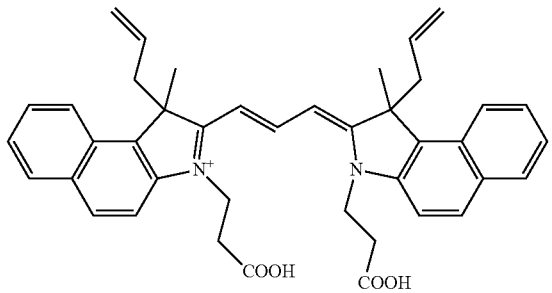

-continued
No. 84
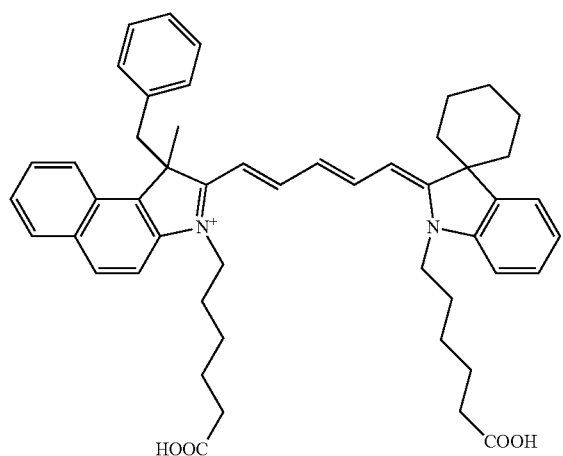
No. 85
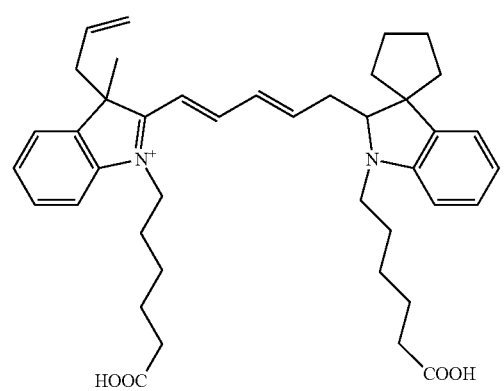
No. 86
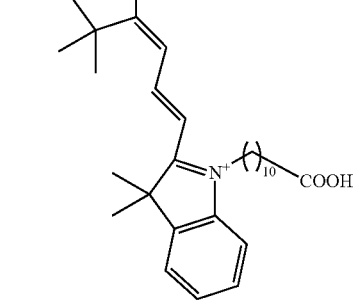
No. 87
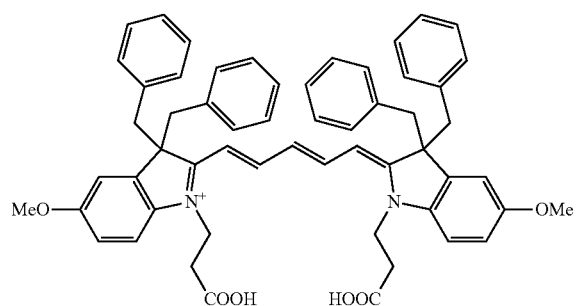
-continued
No. 88
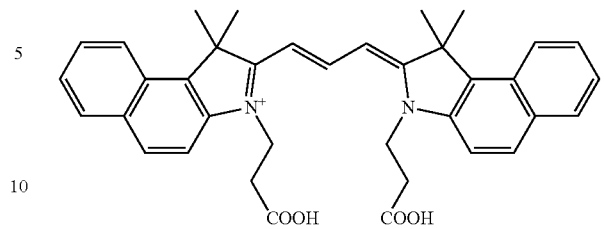
No. 89
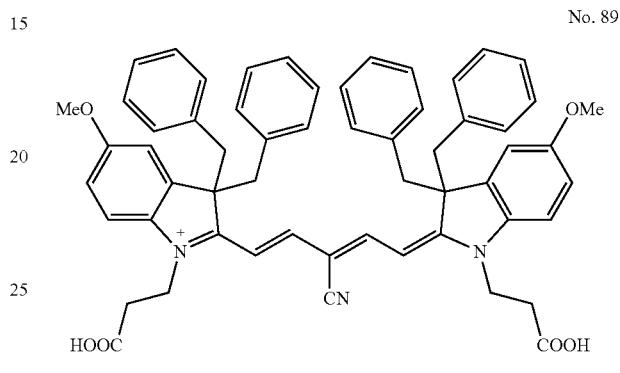
No. 90
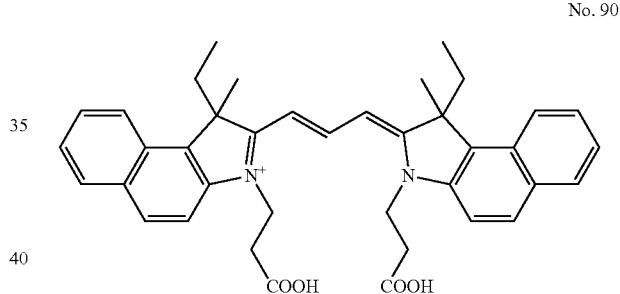
No. 91
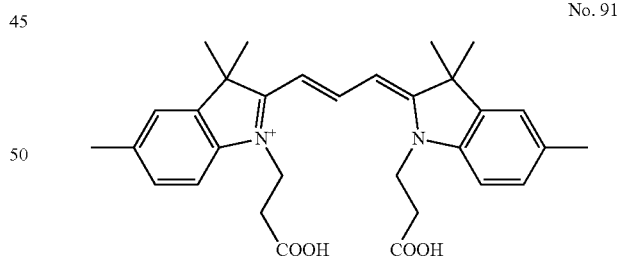
No. 92
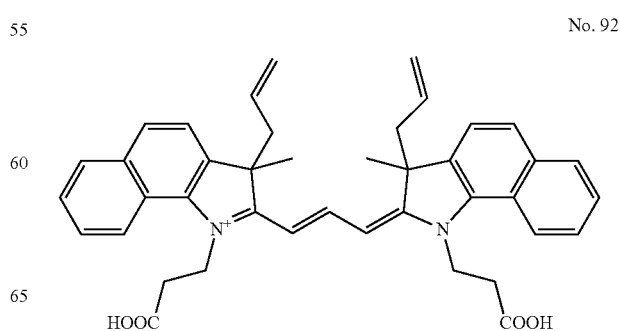

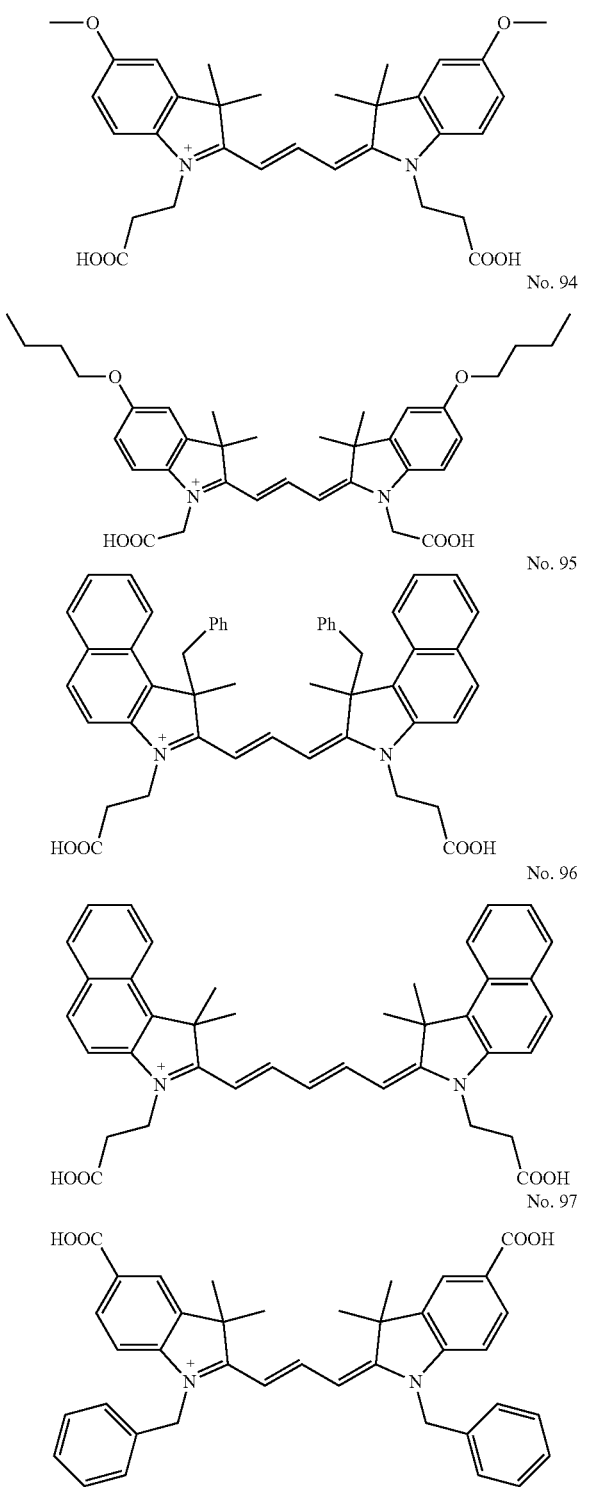

In addition to the compounds of formula (1), dye compounds other than the compounds of formula (1) (hereinafter referred to as "other organic dyes") and organic metal complex compounds are also useful as the dye 13. Dyes having a group adsorbable to the metal oxide semiconductor layer 12 (i.e., the carrier) are preferred. Examples of the group adsorbable to the metal oxide semiconductor layer 12 (carrier) include a carboxyl group, a sulfo group, a phosphate group, and $SiR^6R^7R^8$ as previously recited.

Examples of useful other organic dyes include eosin Y, dibromofluorescein, fluorescein, rhodamine B, pyrogallol, dichlorofluorescein, Erythrosine B, fluorescin, merbromin, merocyanine disazo dyes, trisazo dyes, anthraquinone dyes, polynucleic quinone dyes, indigo dyes, diphenylmethane dyes, trimethyhnethane dyes, quinoline dyes, benzophenone dyes, naphthoquinone dyes, perylene dyes, fluorenone dyes, squarylium dyes, azulenium dyes, perynone dyes, quinacridone dyes, metal-free phthalocyanine dyes, metal-free porphyrin dyes, and metal-free azaporphyrin dyes.

Examples of the organic metal complex compounds include those having both an ionic coordinate bond formed between a nitrogen anion of an aromatic heterocyclic ring and a metal cation and a nonionic coordinate bond formed between a nitrogen atom or a chalcogen atom and a metal cation and those having both an ionic coordinate bond formed between an oxygen or sulfur anion and a metal cation and a nonionic coordinate bond formed between a nitrogen or chalcogen atom and a metal cation. Specific examples of the organic metal complex compounds include metallophthalocyanine dyes, such as copper phthalocyanine, titanyl phthalocyanine, cobalt phthalocyanine, nickel phthalocyanine, and iron phthalocyanine; metallonaphthalocyanine dyes, metalloporphyrin dyes; metalloazaporphyrin dyes; and bipyridyl, terpyridyl, phenanthroline, bicinchoninate, azo, or quinolinol metal complexes using ruthenium, iron, or osmium.

The proportion of the cyanine dye in the dye 13 used in the invention is usually 10 mass % or more, preferably 30 mass % or more, more preferably 40 mass % or more.

The dye 13 may contain, in addition to the above described dyes, one or more additives, such as dye association inhibitors exemplified by cholic acid compounds represented by chemical formula (13) below. These compounds may be used either individually or as a mixture of two or more thereof.

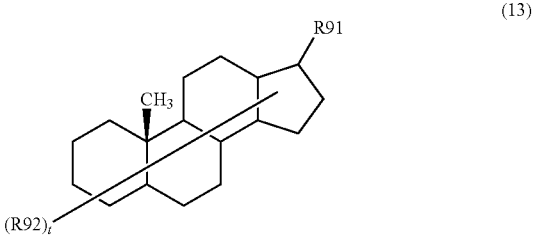

(13)

wherein R91 represents an alkyl group having an acidic group or an alkoxysilyl group; R92 represents a group bonded to any of carbon atoms constructing the steroid skeleton selected from a hydroxyl group, a halogen atom, an alkyl group, an alkoxy group, an aryl group, a heterocyclic group, an acyl group, an acyloxy group, an oxycarbonyl group, an oxo group, an acidic group, an alkoxysilyl group, and derivatives of these groups; a plurality of R92 groups may be the same or different; t represents an integer of 1 to 5; and the carbon-to-carbon bonds constructing the steroid skeleton may be either a single bond or a double bond.

The counter electrode 20 is composed, e.g., of an electroconductive substrate 21 and an electroconductive layer 22 provided thereon and functions as a positive electrode of an outer circuit. Materials for making the electroconductive substrate 21 include those described for making the substrate 11A of the electroconductive substrate 11 of the working electrode 10. The electroconductive layer 22 comprises, for example, at least one electroconductive material and, if necessary, a binder. Examples of the electro conductive material for use in the electroconductive layer 22 include metals, such as platinum, gold, silver, copper (Cu), rhodium (Rh), ruthenium (Ru), aluminum (Al), magnesium (Mg), and indium (In), carbon (C), and electroconductive polymers. Examples of the binder for use in the electroconductive layer 22 include acrylic resins, polyester resins, phenol resins, epoxy resins, cellulose, melamine resins, fluoroelastomers, and polyimide resins. The counter electrode 20 may have a single layer structure formed of the electroconductive layer 22.

The electrolyte-containing layer 30 that can be used in the invention comprises, for example, a redox electrolyte containing a cobalt-based redox couple. The cobalt-based redox couple is exemplified by a combination of a divalent cobalt complex and a trivalent cobalt complex.

The divalent and trivalent cobalt complex combination is exemplified by compounds represented by general formula (2):

$$[Co(L)_{n1}]X_{n2} \quad (2)$$

wherein L represents a mono to tridentate ligand; n1 represents an integer of 2 to 6; X represents a counter ion if necessary to neutralize the electric charge; and n2 represents a coefficient for maintaining overall charge neutrality.

The mono- to tridentate ligand as represented by L in general formula (2) is not particularly limited and any known ligand may be used. The compound of formula (2) preferably has at least one bidentate or tridentate ligand represented by any one of general formulae (L-1) to (L-6) shown below. It is more preferably L is at least one bidentate or tridentate ligand represented by formulae (L-1) to (L-6). It is even more preferably L is at least one ligand represented by formula (L-1), (L-2), or (L-4). Other known ligands represented by L include halogen atoms.

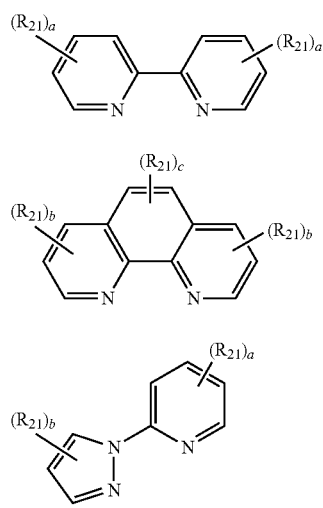

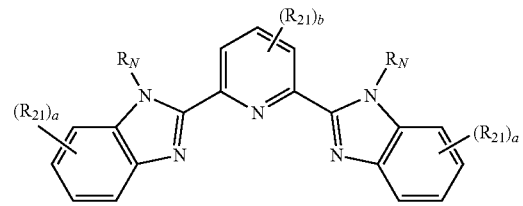

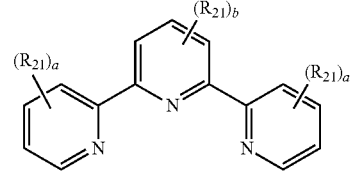

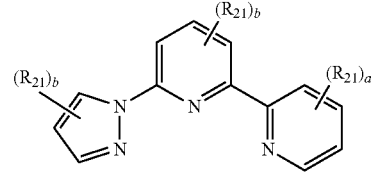

wherein $R_{21}$ has the same meaning as $R^1$; $R_N$ has the same meaning as Y; a represents an integer of 0 to 4; b represents an integer of 0 to 3; and c represents an integer of 0 to 2.

X in formula (2) is an ion that neutralizes the charge on the complex ion, which may be either positive or negative. Examples of the positive ion (cation) as X include an ammonium ion, an alkali metal ion, and a proton. Examples of the negative ion (anion) as X are the same as those described above for An. For use in the dye-sensitized solar cell of the invention, X in formula (2) is preferably an anion, more preferably the same anion as that of the cyanine dye.

In the divalent/trivalent cobalt complex combination, the divalent cobalt complex to trivalent cobalt complex mass ratio is usually, but not limited to, 100:100 to 100:1, preferably 100:50 to 100:5, more preferably 100:35 to 100:8.

Examples of the cation of the cobalt complexes represented by general formula (2) include, but are not limited to, the following cations:

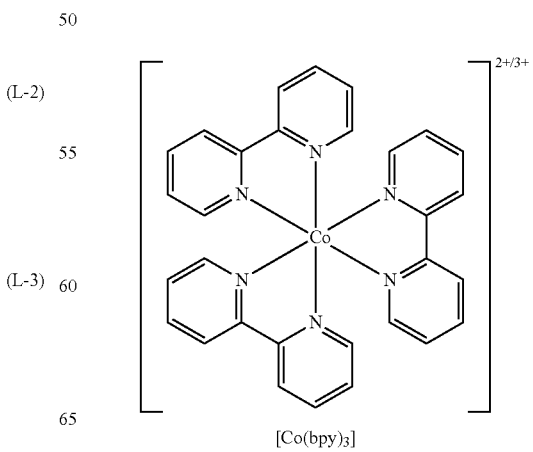

[Co(bpy)₃]

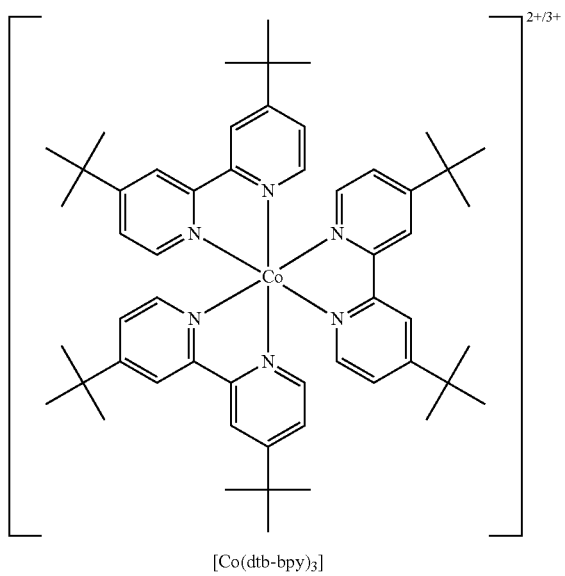

[Co(dtb-bpy)₃]

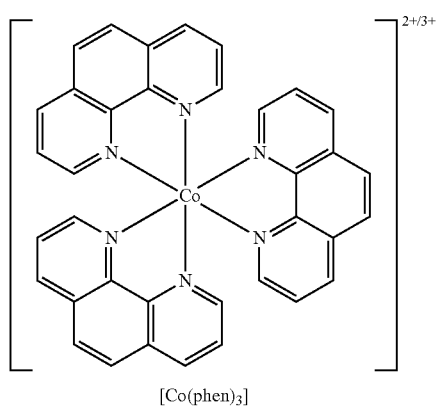

[Co(phen)₃]

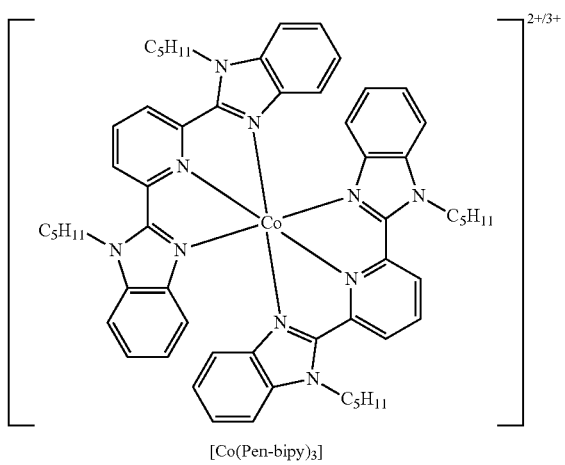

[Co(Pen-bipy)₃]

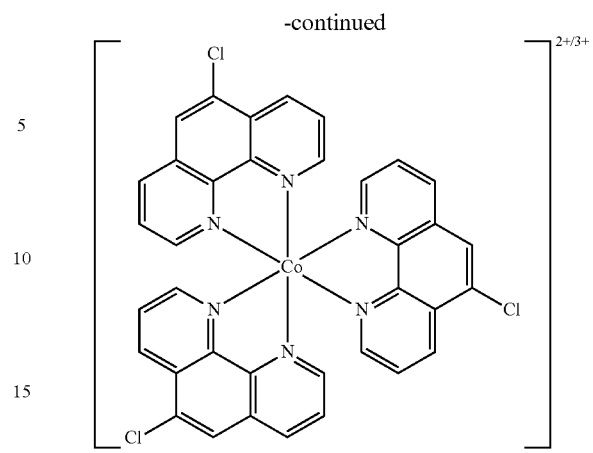

[Co(Cl-phen)₃]

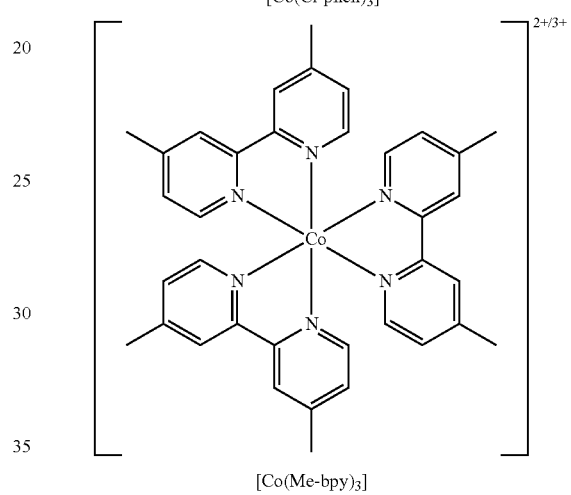

[Co(Me-bpy)₃]

The electrolyte-containing layer 30 may contain other electrolyte in addition to the cobalt-based electrolyte as long as the effects of the invention are not impaired. Examples of the other useful electrolytes include a combination of a halide and an elemental halogen, such as an iodide/iodine couple or a bromide/bromine couple, a quinone/hydroquinone couple, nitroxyl radical compounds, Cu-based complexes, and a thiolate/disulfide complex couple. Examples of the halide include a cesium halide, a quaternary alkylammonium halide, an imidazolium halide, a thiazolium halide, an oxazolium halide, a quinolinium halide, and a pyridinium halide. Specifically, examples of the iodide include cesium iodide; quaternary alkylammonium iodides, such as tetraethylammonium iodide, tetrapropylammonium iodide, tetrabutylammonium iodide, tetrapentylammonium iodide, tetrahexylammonium iodide, tetraheptylammonium iodide, and trimethylphenylammonium iodide; imidazolium iodides, such as 3-methylimidazolium iodide and 1-propyl-2,3-dimethylimidazolium iodide; thiazolium iodides, such as 3-ethyl-2-methyl-2-thiazolium iodide, 3-ethyl-5-(2-hydroxyethyl)-4-methylthiazolium iodide, and 3-ethyl-2-methylbenzothiazolium iodide; oxazolium iodides, such as 3-ethyl-2-methylbenzoxazolium iodide; quinolinium iodides, such as 1-ethyl-2-methylquinolinium iodide; and pyridinium iodides. Examples of the bromides include quaternary alkylammonium bromides.

The ratio of the cobalt-based electrolyte to the whole electrolyte present in the electrolyte-containing layer 30 is preferably 30 mass % or more, more preferably 50 mass % or more, even more preferably 70 mass % or more. It is preferred that the at least one electrolyte selected from a quinone/hydroquinone electrolyte, an $(SCN)_2/SCN^-$ electrolyte, an $(SeCN)_2/SeCN^-$ electrolyte, a cobalt-based electrolyte, and a nitroxy radical compound-based electrolyte be present in the electrolyte-containing layer 30 in an amount of at least 30 mass %, more preferably 50 mass % or more, even more preferably 70 mass % or more.

The electrolyte-containing layer 30 may be a liquid electrolyte (electrolyte solution) prepared by dissolving the redox electrolyte in a solvent or a solid polymer electrolyte in which an electrolyte solution is held in a polymer matrix. The electrolyte-containing layer 30 may also be a pseudo-solid (pasty) electrolyte containing a mixture of an electrolyte solution and a particulate carbon material, such as carbon black. The redox electrolyte may contain an ionic liquid or an organic solvent. Any known ionic liquids may be used. Examples of suitable organic solvents include electrochemically inert solvents, such as acetonitrile, tetrahydrofuran, propionitrile, butyronitrile, methoxyacetonitrile, 3-methoxypropionitrile, valeronitrile, dimethyl carbonate, ethylmethyl carbonate, ethylene carbonate, propylene carbonate, N-methylpyrrolidone, pentanol, quinoline, N,N-dimethylformamide, γ-butyrolactone, dimethyl sulfoxide, propylene carbonate, and 1,4-dioxane. One or more ionic liquids and one or more organic solvents may be used in combination. The ionic liquids and the organic solvents may be used either individually or as a mixture of two or more thereof.

For the purpose of improving power generation efficiency, durability, and the like of the dye-sensitized solar cell, the electrolyte-containing layer 30 may contain acyclic saccharides (see JP 2005-093313A), pyridine compounds (see JP 2003-331936A), urea derivatives (see JP 2003-168493A), and so forth.

When light (sunlight or ultraviolet, visible, or near infra-red light equal to sunlight) enters the dye-sensitized solar cell of the invention, the dye 13 supported in the working electrode 10 absorbs the light, and the thus excited dye 13 injects electrons into the metal oxide semiconductor layer 12. The electrons move to the adjacent electroconductive layer 11B, passes through an outer circuit, and reach the counter electrode 20. On the other hand, the electrolyte in the electrolyte-containing layer 30 is oxidized to return (reduce) the dye 13 having been oxidized with the movement of electrons to the ground state. The oxidized electrolyte is reduced upon receipt of the electrons having reached the counter electrode 20. In this way, the electron movement between the working electrode 10 and the counter electrode 20 and the associated oxidation-reduction reaction in the electrolyte-containing layer 30 are repeated, whereby electrons move continuously to steadily perform photoelectric conversion.

The dye-sensitized solar cell of the invention is made, for example, as follows.

A working electrode 10 is provided. First of all, a metal oxide semiconductor layer 12 having a porous structure is formed on the side of the electroconductive layer 11B of the electroconductive substrate 11 by electrodeposition or firing. The electrodeposition is carried out by, for example, heating an electrolytic bath containing a metal salt providing a metal oxide semiconductor material to a predetermined temperature while bubbling with oxygen or air, immersing the electroconductive substrate 11 therein, and applying a given voltage between the substrate 11 and a counter electrode, thereby to deposit a metal oxide semiconductor material with a porous structure on the electroconductive layer 11B. The counter electrode may be moved appropriately in the electrolytic bath. The firing method is carried out by, for example, dispersing powder of a metal oxide semiconductor material in a medium, applying the resulting slurry to the electroconductive substrate 11, followed by drying, followed by firing to form a porous structure. Then a dye solution of a dye 13 containing a cyanine dye in an organic solvent is prepared. The electroconductive substrate 11 having the metal oxide semiconductor layer 12 is immersed in the dye solution to fix the dye 13 onto the metal oxide semiconductor layer 12.

The concentration of the dye 13 in the dye solution is preferably $1.0 \times 10^{-5}$ to $1.0 \times 10^{-3}$ mol/dm$^3$, more preferably $5.0 \times 10^{-5}$ to $5.0 \times 10^{-4}$ mol/dm$^3$. The organic solvent used to prepare the dye solution is not particularly limited as long as it is capable of dissolving the dye 13. Useful organic solvents include hydrocarbons, such as toluene, benzene, and xylene; alcohols, such as methanol, ethanol, and t-butanol; ether alcohols, such as methyl cello solve, ethyl cellosolve, butyl cellosolve, and butyl diglycol; ketones, such as acetone, methyl ethyl ketone, methyl isobutyl ketone, cyclohexanone, and diacetone alcohol; esters, such as ethyl acetate, butyl acetate, and methoxyethyl acetate; acrylic esters, such as ethyl acrylate and butyl acrylate; fluoroalcohols, such as 2,2,3,3-tetrafluoropropanol; chlorinated hydrocarbons, such as methylene dichloride, dichloroethane, and chloroform; acetonitrile; and tetrahydrofuran. These organic solvents may be used in any combination thereof. Preferred solvents are alcohols.

An electroconductive layer 22 is then formed on one side of an electroconductive substrate 21 to make a counter electrode 20. The electroconductive layer 22 can be formed by, for example, sputtering an electroconductive material.

The working electrode 10 and the counter electrode 20 are put together with an unshown spacer (such as a sealant) therebetween to provide a predetermined space such that the side of the dye 13 of the working electrode 10 and the side of the electroconductive layer 22 of the counter electrode 20 face each other, and the resulting assembly is totally sealed while leaving an inlet for injecting an electrolyte. Subsequently, an electrolyte solution is injected through the inlet into the space between the working electrode 10 and the counter electrode 20, followed by sealing the inlet to form the electrolyte-containing layer 30. There is thus completed a dye-sensitized solar cell 100 illustrated in FIGS. 1 and 2.

EXAMPLES

The invention will now be illustrated in greater detail with reference to Examples and Comparative Examples, but it should be understood that the invention is not deemed to be limited thereto.

The above described dye-sensitized solar cell 100 was made according to the following procedure.

Preparation of Titanium Oxide Carrier (Working Electrode) (Electroconductive Substrate 11):

An electroconductive substrate 11 made of electroconductive glass (F—SnO$_2$) and measuring 2.0 cm in length, 1.5 cm in width, and 1.1 mm in thickness was prepared. A 70 μm thick masking tape was stuck on the substrate 11 to surround a 0.5 cm-side square. A metal oxide slurry prepared by suspending titanium oxide powder (Ti-Nanoxide D, $TiO_2$ from Solaronix) in water in a concentration of 10 wt % was applied to the square to a uniform thickness and dried. After the masking tape was removed, the substrate was fired in an electric oven at 450° C. to form a metal oxide semiconductor layer 12 with a thickness of about 5 μm.

containing layer 30, thereby to make a dye-sensitized solar cell. The upper side of the cell was covered with a mask having an opening of 1 $cm^2$. The conversion efficiency (%) of the resulting solar cell was determined using a solar simulator under the standardized conditions of AM 1.5 G and 100 $mW/cm^2$. The results obtained are shown in Table 1.

TABLE 1

| | | Dye | | | | Conversion |
|---|---|---|---|---|---|---|
| | | Cyanine dye | | Other | | |
| | Carrier | Cation | Anion | dye | Electrolyte solution | efficiency/% |
| Example 1 | ZnO | No. 89 | I⁻ | — | Electrolyte solution 1 | 1.03 |
| Example 2 | ZnO | No. 89 | $(CF_3SO_2)_2N^-$ | — | Electrolyte solution 1 | 0.95 |
| Example 3 | ZnO | No. 90 | I⁻ | — | Electrolyte solution 1 | 1.44 |
| Example 4 | $TiO_2$ | No. 90 | I⁻ | — | Electrolyte solution 1 | 1.48 |
| Example 5 | ZnO | No. 89 | I⁻ | Dye 1 | Electrolyte solution 1 | 2.60 |
| Example 6 | ZnO | No. 90 | I⁻ | Dye 1 | Electrolyte solution 1 | 2.80 |
| Example 7 | $TiO_2$ | No. 90 | I⁻ | Dye 1 | Electrolyte solution 1 | 2.81 |
| Example 8 | $TiO_2$ | No. 91 | I⁻ | — | Electrolyte solution 1 | 1.33 |
| Example 9 | $TiO_2$ | No. 92 | I⁻ | — | Electrolyte solution 1 | 1.67 |
| Example 10 | $TiO_2$ | No. 93 | I⁻ | — | Electrolyte solution 1 | 1.61 |
| Example 11 | $TiO_2$ | No. 94 | I⁻ | — | Electrolyte solution 1 | 1.22 |
| Example 12 | $TiO_2$ | No. 95 | I⁻ | — | Electrolyte solution 1 | 1.58 |
| Example 13 | $TiO_2$ | No. 96 | I⁻ | — | Electrolyte solution 1 | 1.55 |
| Example 14 | $TiO_2$ | No. 97 | I⁻ | — | Electrolyte solution 1 | 1.19 |
| Example 15 | $TiO_2$ | No. 93 | $BF_4^-$ | — | Electrolyte solution 1 | 1.52 |
| Example 16 | $TiO_2$ | No. 93 | $PF_6^-$ | — | Electrolyte solution 1 | 1.70 |
| Example 17 | $TiO_2$ | No. 93 | $BF_4^-$ | — | Electrolyte solution 2 | 1.69 |
| Example 18 | $TiO_2$ | No. 93 | $B(CN)_4^-$ | — | Electrolyte solution 3 | 1.66 |
| Example 19 | $TiO_2$ | No. 93 | $(CF_3SO_2)_2N^-$ | — | Electrolyte solution 4 | 1.59 |
| Example 20 | $TiO_2$ | No. 90 | I⁻ | — | Electrolyte solution 5 | 1.44 |
| Example 21 | $TiO_2$ | No. 90 | I⁻ | — | Electrolyte solution 6 | 1.48 |
| Example 22 | $TiO_2$ | No. 90 | I⁻ | — | Electrolyte solution 7 | 1.43 |
| Example 23 | ZnO | No. 89 | I⁻ | — | Electrolyte solution 8 | 1.12 |
| Comparative example 1 | ZnO | — | — | Dye 2 | Electrolyte solution 1 | 0.34 |
| Comparative example 2 | ZnO | — | — | Dye 3 | Electrolyte solution 1 | 0.00 |
| Comparative example 3 | ZnO | No. 90 | I⁻ | — | Electrolyte solution 9 | 1.15 |

Preparation of Zinc Oxide Carrier (Working Electrode) (Electroconductive Substrate 11):

An electroconductive substrate 11 having zinc oxide as a carrier was prepared in the same manner as for the titanium oxide carrier, except for replacing the titanium oxide powder with zinc oxide powder having an average particle size of 20 nm (FINEX-50, from Sakai Chemical Industry).

Fixing of Dye (Preparation of Working Electrode 10):

The dye or dyes shown in Table 1 below was/were dissolved in ethanol in a concentration of $3\times10^{-4}$ $mol/dm^3$ to prepare a dye solution. The above prepared electroconductive substrate 11 having the metal oxide semiconductor layer 12 was immersed in the dye solution to make a working electrode 10 having the dye 13 supported thereon. When a combination of a cyanine dye and another dye is used, each of them was dissolved in the concentration of $3\times10^{-4}$ $mol/dm^3$.

Making of Dye-Sensitized Solar Cell and Evaluation of Conversion Efficiency

As illustrated in FIG. 1, the prepared working electrode 10 and a counter electrode 20 were assembled together with a 63 μm thick spacer therebetween to provide a space for an electrolyte-containing layer 30 therebetween and fixed by clips. The counter electrode was made by coating an ITO electrode (from Nishinoda Denko Co., Ltd.) as an electroconductive substrate 21 with graphite particles (electroconductive layer 22). An electrolyte solution described in Table 1 was penetrated into the space to form an electrolyte- Electrolyte Solutions 1 to 8:

Electrolyte solutions 1 to 8 were each prepared by mixing and dissolving a divalent cobalt complex (0.22 $mol/dm^3$), a trivalent cobalt complex (0.022 $mol/dm^3$), and lithium perchlorate (0.1 $mol/dm^3$) in a solvent at their respective concentrations according to the formulation of Table 2.

TABLE 2

| | Divalent cobalt complex | Trivalent cobalt complex | Solvent |
|---|---|---|---|
| Electrolyte solution 1 | $[Co(bpy)_3][PF_6]_2$ | $[Co(bpy)_3][PF_6]_3$ | MeCN |
| Electrolyte solution 2 | $[Co(bpy)_3][BF_4]_2$ | $[Co(bpy)_3][BF_4]_3$ | MeCN |
| Electrolyte solution 3 | $[Co(bpy)_3][B(CN)_4]_2$ | $[Co(bpy)_3][B(CN)_4]_3$ | MeCN |
| Electrolyte solution 4 | $[Co(bpy)_3][(CF_3SO_2)_2N]_2$ | $[Co(bpy)_3][(CF_3SO_2)_2N]_3$ | MeCN |
| Electrolyte solution 5 | $[Co(phen)_3][PF_6]_2$ | $[Co(phen)_3][PF_6]_3$ | MeCN |
| Electrolyte solution 6 | $[Co(Cl-phen)_3][PF_6]_2$ | $[Co(Cl-phen)_3][PF_6]_3$ | MeCN |
| Electrolyte solution 7 | $[Co(Me-bpy)_3][PF_6]_2$ | $[Co(Me-bpy)_3][PF_6]_3$ | MeCN |
| Electrolyte solution 8 | $[Co(bpy)]_3[PF_6]_2$ | $[Co(bpy)]_3[PF_6]_3$ | PC |

MeCN: acetonitrile
PC: propylene carbonate

Electrolyte Solution 9:

Electrolyte solution 9 was prepared by mixing and dissolving 4-t-butylpyridine (0.5 mol/dm$^3$), lithium iodide (0.5 mol/dm$^3$), and iodine (0.05 mol/dm$^3$) in acetonitrile at their respective concentrations.

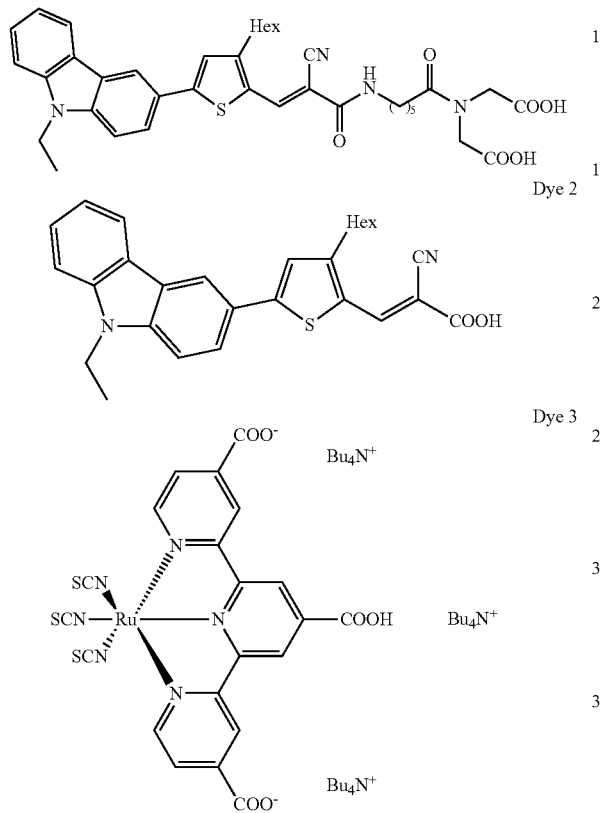

wherein Hex is hexyl; and Bu is butyl.

DESIGNATION OF REFERENCE NUMERALS

10 Working electrode
11 Electroconductive substrate
11A Substrate
11B Electro conductive layer
12 Metal oxide semiconductor layer
12A Dense layer
12B Porous layer
13 Dye
20 Counter electrode
21 Electroconductive substrate
22 Electroconductive layer
30 Electrolyte-containing layer
100 Dye-sensitized solar cell

The invention claimed is:

1. A dye-sensitized solar cell comprising a working electrode and a counter electrode facing each other with an electrolyte layer there between, the working electrode having a dye-supporting metal oxide electrode comprising a metal oxide layer and a dye supported on the metal oxide layer,
the dye comprising a cyanine dye, and
the electrolyte of the electrolyte layer comprising a cobalt-based electrolyte.

2. The dye-sensitized solar cell according to claim 1, wherein the cyanine dye is at least one compound represented by general formula (1):

wherein A represents a group selected from group I consisting of (a) to (m); A' represents a group selected from group II consisting of (a') to (m');

Q represents a linking group constituting a methine chain having 1 to 9 carbon atoms and optionally containing a cyclic structure in the methine chain, the hydrogen atom of the methine chain being optionally replaced with a hydroxyl group, a halogen atom, a cyano group, —NRR', an aryl group, an arylalkyl group, or an alkyl group, the —NRR', aryl, arylakyl, and alkyl groups being optionally substituted by a hydroxyl group, a halogen atom, a cyano group, or —NRR' and optionally interrupted by —O—, —S—, —CO—, —COO—, —OCO—, —SO$_2$—, —NH—, —CONH—, —NHCO—, —N═CH—, or —CH═CH—; wherein R and R' represents an aryl group, an arylalkyl group, or an alkyl group; and An$^{q-}$ represents a q-valent anion, wherein q represents 1 or 2, and p represents a coefficient for maintaining overall charge neutrality, Group I

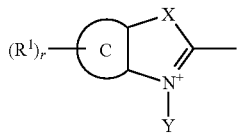

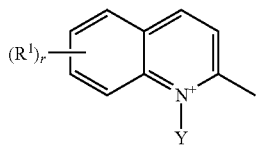

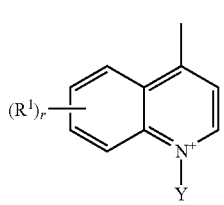

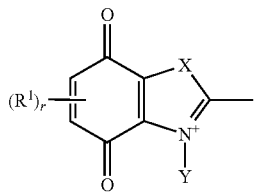

-continued
(e)
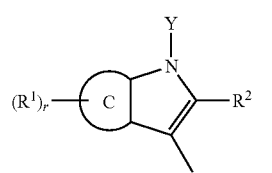
(f)
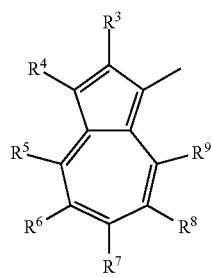
(g)
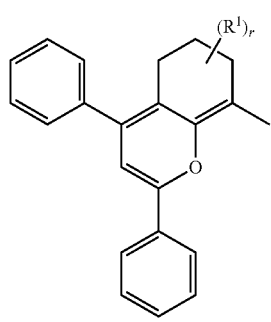
(h)
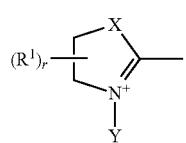
(i)
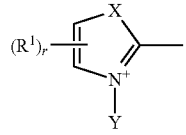
(j)
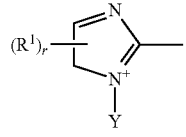
(k)
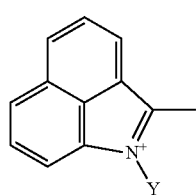
(l)
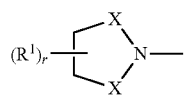
(m)
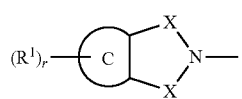
-continued
Group II
(a')
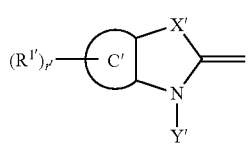
(b')
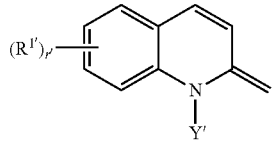
(c')
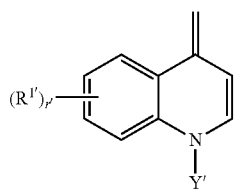
(d')
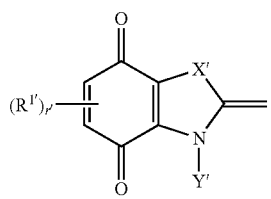
(e')
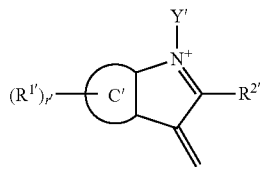
(f')
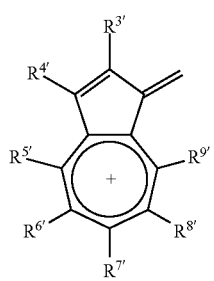
(g')
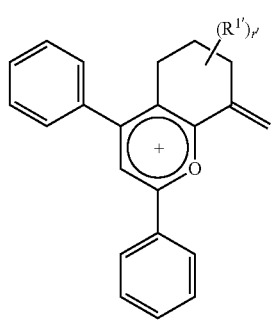

-continued

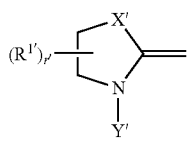 (h')

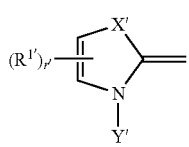 (i')

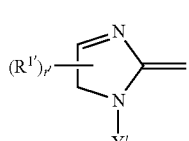 (j')

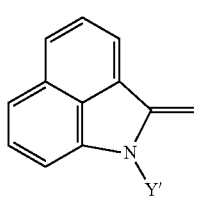 (k')

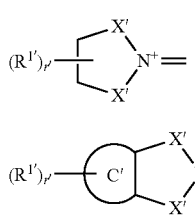 (l')

(m')

wherein ring C and ring C' each represent a benzene ring, a naphthalene ring, a phenanthrene ring, or a pyridine ring;

$R^1$ and $R^{1'}$ each represent a hydroxyl group, a halogen atom, a nitro group, a cyano group, a sulfo group, a phosphate group, a carboxyl group, an amino group, an amido group, a ferrocenyl group, an aryl group having 6 to 30 carbon atoms, an arylalkyl group having 7 to 30 carbon atoms, or an alkyl group having 1 to 8 carbon atoms, the C6-C30 aryl, C7-C30 arylalkyl, and C1-C8 alkyl groups being optionally substituted by a hydroxyl group, a halogen atom, a nitro group, a cyano group, a sulfo group, a phosphate group, a carboxyl group, an amino group, an amido group, or a ferrocenyl group and optionally interrupted by —O—, —S—, —CO—, —COO—, —OCO—, —SO$_2$—, —NH—, —CONH—, —NHCO—, —N=CH—, or —CH=CH—;

$R^2$, $R^3$, $R^4$, $R^5$, $R^6$, $R^7$, $R^8$, $R^9$, $R^{2'}$, $R^{3'}$, $R^{4'}$, $R^{5'}$, $R^{6'}$, $R^{7'}$, $R^{8'}$, and $R^{9'}$ each have the same meaning as $R^1$ and $R^{1'}$ or represents a hydrogen atom;

X and X' each represent an oxygen atom, a sulfur atom, a selenium atom, —CR$^{51}$R$^{52}$—, a cycloalkane-1,1-diyl group having 3 to 6 carbon atoms, —NH—, or —NY$^2$—, wherein R$^{5'}$ and R$^{52}$ each have the same meaning as $R^1$ and $R^{1'}$ or represent a hydrogen atom;

Y, Y', and Y$^2$ each represent a hydrogen atom, an alkyl group having 1 to 20 carbon atoms, an aryl group having 6 to 30 carbon atoms, or an arylalkyl group having 7 to 30 carbon atoms, the alkyl, aryl, and arylalkyl groups being optionally substituted by a hydroxyl group, a halogen atom, a cyano group, a carboxyl group, an amino group, an amido group, a ferrocenyl group, a sulfo group, a phosphate group, —SiR$^6$R$^7$R$^8$, or a nitro group, the methylene moiety of the alkyl, aryl, or arylalkyl group as Y, Y', and Y$^2$ being optionally interrupted by —O—, —S—, —CO—, —COO—, —OCO—, —SO$_2$—, —NH—, —CONH—, —NHCO—, —N=CH—, or —CH=CH—; and r and r' each represent a number of from 0 to the maximum number of possible substituents in (a) to (e), (g) to (j), (l), (m), (a') to (e'), (g') to (j'), (l'), and (m').

3. The dye-sensitized solar cell according to claim 2, wherein the compound represented by general formula (1) is a compound in which Q is represented by any one of (Q-1) to (Q-11):

 (Q-1)

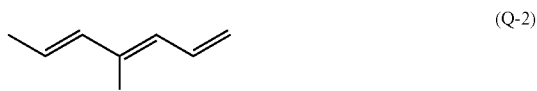 (Q-2)

 (Q-3)

 (Q-4)

 (Q-5)

 (Q-6)

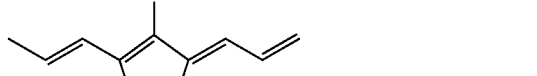 (Q-7)

 (Q-8)

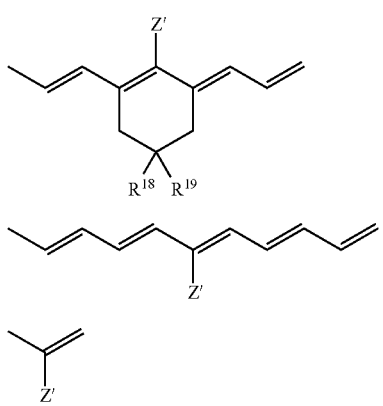

wherein $R^{14}$, $R^{15}$, $R^{16}$, $R^{17}$, $R^{18}$, $R^{19}$, and Z' each independently represent a hydrogen atom, a hydroxyl group, a halogen atom, a cyano group, —NRR', an aryl group, an arylalkyl group, or an alkyl group, the —NRR', aryl, arylakyl, and alkyl groups being optionally substituted by a hydroxyl group, a halogen atom, a cyano group, or —NRR' and optionally interrupted by —O—, —S—, —CO—, —COO—, —OCO—, —SO$_2$—, —NH—, —CONH—, —NHCO—, —N═CH—, or —CH═CH—; and R and R' each represent an aryl group, an arylalkyl group, or an alkyl group.

4. The dye-sensitized solar cell according to claim 2, wherein the compound represented by general formula (1) is a compound having one or two groups selected from (a) to (e), (h) to (m), (a') to (e'), and (h') to (m').

5. The dye-sensitized solar cell according to claim 2, wherein the compound represented by general formula (1) is a compound in which A is a group selected from (a) and (h) to (k); A' is a group selected from (a') and (h') to (k'); Q is a linking group constituting a methine chain having 1, 3, 5, or 7 carbon atoms and optionally containing a cyclic structure, the hydrogen atom of the methine chain being optionally replaced with a hydroxyl group, a halogen atom, a cyano group, —NRR', an aryl group, an arylalkyl group, or an alkyl group; the —NRR', aryl, arylalkyl, and alkyl group being optionally substituted by a hydroxyl group, a halogen atom, a cyano group, or NRR' and optionally interrupted by —O—, —S—, —CO—, —COO—, —OCO—, —SO$_2$—, —NH—, —CONH—, —NHCO—, —N═CH—, or —CH═CH—; and R and R' are each an aryl group, an arylalkyl group, or an alkyl group.

6. The dye-sensitized solar cell according to claim 3, wherein the compound represented by general formula (1) is a compound having one or two groups selected from (a) to (e), (h) to (m), (a') to (e'), and (h') to (m').

7. The dye-sensitized solar cell according to claim 3, wherein the compound represented by general formula (1) is a compound in which A is a group selected from (a) and (h) to (k); A' is a group selected from (a') and (h') to (k'); Q is a linking group constituting a methine chain having 1, 3, 5, or 7 carbon atoms and optionally containing a cyclic structure, the hydrogen atom of the methine chain being optionally replaced with a hydroxyl group, a halogen atom, a cyano group, —NRR', an aryl group, an arylalkyl group, or an alkyl group; the —NRR', aryl, arylalkyl, and alkyl group being optionally substituted by a hydroxyl group, a halogen atom, a cyano group, or NRR' and optionally interrupted by —O—, —S—, —CO—, —COO—, —COO—, —SO$_2$—, —NH—, —CONH—, —NHCO—, —N═CH—, or —CH═CH—; and R and R' are each an aryl group, an arylalkyl group, or an alkyl group.

8. The dye-sensitized solar cell according to claim 4, wherein the compound represented by general formula (1) is a compound in which A is a group selected from (a) and (h) to (k); A' is a group selected from (a') and (h') to (k'); Q is a linking group constituting a methine chain having 1, 3, 5, or 7 carbon atoms and optionally containing a cyclic structure, the hydrogen atom of the methine chain being optionally replaced with a hydroxyl group, a halogen atom, a cyano group, —NRR', an aryl group, an arylalkyl group, or an alkyl group; the —NRR', aryl, arylalkyl, and alkyl group being optionally substituted by a hydroxyl group, a halogen atom, a cyano group, or NRR' and optionally interrupted by —O—, —S—, —CO—, —COO—, —OCO—, —SO$_2$—, —NH—, —CONH—, —NHCO—, —N═CH—, or —CH═CH—; and R and R' are each an aryl group, an arylalkyl group, or an alkyl group.

9. The dye-sensitized solar cell according to claim 6, wherein the compound represented by general formula (1) is a compound in which A is a group selected from (a) and (h) to (k); A' is a group selected from (a') and (h') to (k'); Q is a linking group constituting a methine chain having 1, 3, 5, or 7 carbon atoms and optionally containing a cyclic structure, the hydrogen atom of the methine chain being optionally replaced with a hydroxyl group, a halogen atom, a cyano group, —NRR', an aryl group, an arylalkyl group, or an alkyl group; the —NRR', aryl, arylalkyl, and alkyl group being optionally substituted by a hydroxyl group, a halogen atom, a cyano group, or NRR' and optionally interrupted by —O—, —S—, —CO—, —COO—, —OCO—, —SO$_2$—, —NH—, —CONH—, —NHCO—, —N═CH—, or —CH═CH—; and R and R' are each an aryl group, an arylalkyl group, or an alkyl group.

10. The dye-sensitized solar cell according to claim 1, wherein the dye further comprises an additional dye selected from the group consisting of carbazole dye, eosin Y, dibromofluorescein, fluorescein, rhodamine B, pyrogallol, dichlorofluorescein, Erythrosine B, fluorescin, merbromin, merocyanine disazo dyes, trisazo dyes, anthraquinone dyes, polynucleic quinone dyes, indigo dyes, diphenylmethane dyes, trimethylmethane dyes, quinoline dyes, benzophenone dyes, naphthoquinone dyes, perylene dyes, fluorenone dyes, squarylium dyes, azulenium dyes, perynone dyes, quinacridone dyes, metal-free phthalocyanine dyes, metal-free porphyrine dyes, metal-free azaporphyrin dyes, and organic metal complex compounds.

11. The dye-sensitized solar cell according to claim 10, wherein the additional dye has a carboxyl group.

12. The dye-sensitized solar cell according to claim 1, wherein the dye further comprises a carbazole dye.

13. The dye-sensitized solar cell according to claim 1, wherein the cobalt-based electrolyte comprises a combination of a divalent cobalt complex and a trivalent cobalt complex, the divalent cobalt complex and the trivalent cobalt complex being represented by general formula (2):

wherein L represents a mono to tridentate ligand; n1 represents an integer of 2 to 6; X represents a counter ion if necessary to neutralize the electric charge; and n2 represents a coefficient for maintaining overall charge neutrality.

14. The dye-sensitized solar cell according to claim 13, wherein, the cyanine dye has an anion that is the same as X in formula (2).

15. The dye-sensitized solar cell according to claim 13, wherein a mass ratio of the trivalent cobalt complex with respect to 100 parts by mass of the divalent cobalt complex is 5:100 to 50:100.

16. The dye-sensitized solar cell according to claim 13, wherein a mass ratio of the trivalent cobalt complex with respect to 100 parts by mass of the divalent cobalt complex is 8:100 to 35:100.

* * * * *